US011852598B2

(12) United States Patent
Aguiar

(10) Patent No.: US 11,852,598 B2
(45) Date of Patent: Dec. 26, 2023

(54) HYPERDIMENSIONAL SCANNING TRANSMISSION ELECTRON MICROSCOPY AND EXAMINATIONS AND RELATED SYSTEMS, METHODS, AND DEVICES

(71) Applicant: Battelle Energy Alliance, LLC, Idaho Falls, ID (US)

(72) Inventor: Jeffery A. Aguiar, Salt Lake City, UT (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 287 days.

(21) Appl. No.: 17/309,074

(22) PCT Filed: Oct. 23, 2019

(86) PCT No.: PCT/US2019/057624
§ 371 (c)(1),
(2) Date: Apr. 21, 2021

(87) PCT Pub. No.: WO2020/096774
PCT Pub. Date: May 14, 2020

(65) Prior Publication Data
US 2021/0381992 A1 Dec. 9, 2021

Related U.S. Application Data

(60) Provisional application No. 62/755,932, filed on Nov. 5, 2018.

(51) Int. Cl.
*G01N 23/20058* (2018.01)
*H01J 37/28* (2006.01)

(52) U.S. Cl.
CPC ........ *G01N 23/20058* (2013.01); *H01J 37/28* (2013.01); *G01N 2223/418* (2013.01);
(Continued)

(58) Field of Classification Search
CPC .. H01J 37/00; H01J 37/02; H01J 37/22; H01J 37/222; H01J 37/24; H01J 37/244;
(Continued)

(56) References Cited

U.S. PATENT DOCUMENTS 5,428,657 A * 6/1995 Papanicolopoulos .. G01N 33/12
378/90
6,118,850 A * 9/2000 Mayo ................. G01N 23/2076
378/82

(Continued)

OTHER PUBLICATIONS

International Search Report from International Application No. PCT/US2019/057624, dated Jan. 9, 2020, 2 pages.
(Continued)

*Primary Examiner* — Jason L McCormack
(74) *Attorney, Agent, or Firm* — TraskBritt

(57) ABSTRACT

A material identification system includes one or more data interfaces configured to receive first sensor data generated by a first sensor responsive to a material sample, and receive second sensor data generated by a second sensor responsive to the material sample. The material identification system also includes one or more processors configured to generate a set of predictions of an identification of the material sample and a corresponding set of certainty information.

20 Claims, 17 Drawing Sheets

(52) U.S. Cl.
CPC .............. *H01J 2237/2802* (2013.01); *H01J 2237/2804* (2013.01)

(58) Field of Classification Search
CPC .......... H01J 37/26; H01J 37/261; H01J 37/28; H01J 2237/2802; H01J 2237/2804; H01J 2237/2445; H01J 2237/24455; G01N 23/20058; G01N 23/2251
USPC .......................................... 250/306, 307, 311
See application file for complete search history.

(56) References Cited

U.S. PATENT DOCUMENTS

| | | | |
|---|---|---|---|
| 8,299,432 | B2 | 10/2012 | Toth et al. |
| 8,933,401 | B1* | 1/2015 | Reed .................. H01J 37/28 250/559.07 |
| 2010/0153323 | A1* | 6/2010 | Hennessy .............. G01N 21/65 706/20 |
| 2011/0237446 | A1* | 9/2011 | Treado ................. G06V 20/698 506/8 |
| 2012/0035884 | A1* | 2/2012 | Ingram .................. G06F 17/18 702/181 |
| 2014/0368819 | A1* | 12/2014 | Multari ................ A61B 5/4845 356/318 |

OTHER PUBLICATIONS

International Written Opinion from International Application No. PCT/US2019/057624, dated Jan. 9, 2020, 7 pages.

\* cited by examiner

FIG. 17 ns # HYPERDIMENSIONAL SCANNING TRANSMISSION ELECTRON MICROSCOPY AND EXAMINATIONS AND RELATED SYSTEMS, METHODS, AND DEVICES

CROSS-REFERENCE TO RELATED APPLICATIONS

This application is a national phase entry under 35 U.S.C. § 371 of International Patent Application PCT/US2019/057624, filed Oct. 23, 2019, designating the United States of America and published as International Patent Publication WO 2020/096774 A1 on May 14, 2020, which claims the benefit of the filing date of U.S. Provisional Patent Application Ser. No. 62/755,932, filed Nov. 5, 2018, for "SYSTEMS, DEVICES, AND METHODS FOR REALIZING HYPERDIMENSIONAL SCANNING TRANSMISSION ELECTRON MICROSCOPY AND EXAMINATIONS," the entire disclosure of which is hereby incorporated herein by this reference.

STATEMENT REGARDING FEDERALLY SPONSORED RESEARCH OR DEVELOPMENT

This invention was made with government support under Contract No. DE-AC07-05-ID14517 awarded by the United States Department of Energy. The government has certain rights in the invention.

TECHNICAL FIELD

Embodiments of the present disclosure relate generally to systems, devices, and methods for scanning transmission electron microscopy.

BACKGROUND

A scanning transmission electron microscope (STEM) is a type of transmission electron microscope (TEM) in which images are formed by electrons passing through a sufficiently thin specimen. In STEM, the electron beam is focused to a fine spot and then scanned over the sample in a raster illumination system so that each point sample illuminated with the beam is parallel to the optical axis. Electrons that are transmitted through the sample are collected by an electron detector on the far side of the sample. The scattering of the electron beam at different points on the sample depends on the sample properties, such as its atomic number and thickness.

An image is formed with the intensity of each point on the image corresponding to the number of electrons collected as the primary beam impacts a corresponding point on the surface. The image contrast in a STEM depends on detecting only electrons that are transmitted with minimum deflections (referred to as "bright field" detection) or detecting only electrons that are scattered at an angle greater than a specified minimum angle (referred to as "dark field" detection). Unscattered electrons are electrons that are scattered at less than a pre-specified angle. If a detector were to detect all transmitted electrons, regardless of their exit angle from the sample with respect to the electron beam axis, each pixel would have similar brightness, and the image contrast would correspond to differences between the energy of electrons transmitted through different regions of the sample. Such "electron energy attenuation" contrast arises from the fact that the efficiency of STEM detectors such as solid state detectors and scintillator-photomultiplier detectors is a function of the transmitted electron energy. However, the energy spectrum of transmitted electrons is typically relatively narrow and the corresponding electron energy attenuation contrast is weak and vastly inferior to bright and dark field image contrast.

STEM provides the ability for improved materials research by performing a detailed structural analysis and chemistry of material specimens. A growing percentage of materials research now utilizes STEM-based energy dispersive x-ray and electron energy loss spectroscopy to provide weighted distributions of elements at the atomic or higher size-scales. On the other hand, diffraction imaging, the only accepted crystallography-based technique for resolving structural-related information, is not nearly as frequently utilized due to the prohibitive spatial resolution formed using the smallest available probe forming apertures and convergence angles. By the exact nature of atomic defects and interfaces, this mode of operation is not correlative nor compatible with atomic-scale STEM-based imaging and chemistry.

BRIEF SUMMARY

In some embodiments a material identification system includes one or more data interfaces configured to: receive first sensor data generated by a first sensor responsive to a material sample; and receive second sensor data generated by a second sensor responsive to the material sample. The material identification system also includes one or more processors operably coupled to the one or more data interfaces. The one or more processors are configured to: generate a first preliminary set of predictions of an identification of the material sample and a corresponding first preliminary set of certainty information responsive to the first sensor data; generate a second preliminary set of predictions of the identification of the material sample and a corresponding second preliminary set of certainty information responsive to the second sensor data; and narrow the first preliminary set of predictions based on the second preliminary set of predictions, the first preliminary set of certainty information, and the second preliminary second set of certainty information to generate a set of predictions of the identification of the material sample and a corresponding set of certainty information.

In some embodiments a method of identifying a material sample includes: generating first sensor data using a first sensor responsive to the material sample; generating second sensor data using a second sensor responsive to the material sample, the second sensor different from the first sensor; correlating the first sensor data to material information stored in one or more databases to generate a first preliminary set of predictions of an identity of the material sample; correlating the second sensor data to material information stored in one or more databases to generate a second preliminary set of predictions of the identity of the material sample; and narrowing the first preliminary set of predictions responsive to the second preliminary set of predictions to generate a set of predictions of the identity of the material sample.

BRIEF DESCRIPTION OF THE DRAWINGS

While the specification concludes with claims particularly pointing out and distinctly claiming what are regarded as embodiments of the present disclosure, various features and advantages of embodiments of the disclosure may be more readily ascertained from the following description of example embodiments of the disclosure when read in conjunction with the accompanying drawings, in which:

FIG. 17 illustrates confusion matrices of family level predictions, according to some embodiments.

DETAILED DESCRIPTION

Figure 1:
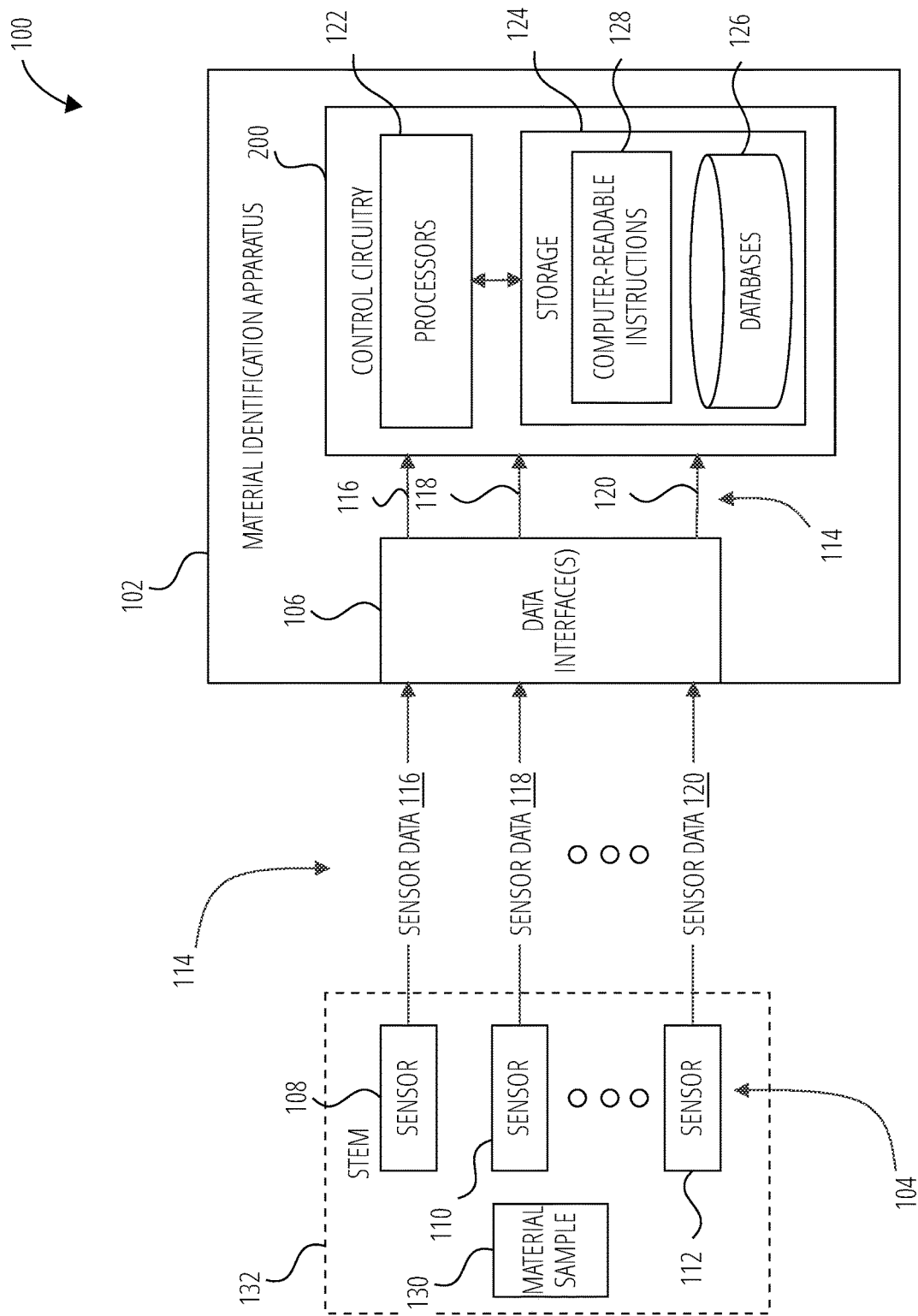
FIG. 1 is a block diagram of a material identification system, according to some embodiments.

In the following description, reference is made to the accompanying drawings in which are shown, by way of illustration, specific embodiments in which the disclosure may be practiced. The embodiments are intended to describe aspects of the disclosure in sufficient detail to enable those skilled in the art to make, use, and otherwise practice the invention. Furthermore, specific implementations shown and described are only examples and should not be construed as the only way to implement the present disclosure unless specified otherwise herein. It will be readily apparent to one of ordinary skill in the art that the various embodiments of the present disclosure may be practiced by numerous other partitioning solutions. Other embodiments may be utilized and changes may be made to the disclosed embodiments without departing from the scope of the disclosure. The following detailed description is not to be taken in a limiting sense, and the scope of the present disclosure is defined only by the appended claims.

In the following description, elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths, and the present disclosure may be implemented on any number of data signals including a single data signal.

The various illustrative logical blocks, modules, and circuits described in connection with the embodiments disclosed herein may be implemented or performed with a general purpose processor, a special purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A general-purpose processor may be considered a special-purpose processor while the general-purpose processor executes instructions (e.g., software code) stored on a computer-readable medium. A processor may also be implemented as a combination of computing devices, e.g., a combination of a DSP and a microprocessor, a plurality of microprocessors, one or more microprocessors in conjunction with a DSP core, or any other such configuration.

Also, it is noted that embodiments may be described in terms of a process that may be depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a function, a procedure, a subroutine, a subprogram, etc. Furthermore, the methods disclosed herein may be implemented in hardware, software, or both. If implemented in software, the functions may be stored or transmitted as one or more instructions or code on computer-readable media. Computer-readable media include both computer storage media and communication media, including any medium that facilitates transfer of a computer program from one place to another.

It should be understood that any reference to an element herein using a designation such as "first," "second," and so forth, does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

Embodiments of the disclosure include STEM architecture and platforms that are configured to combine imaging, spectroscopy, diffraction, and chemistry into a multidimensional dataset by operating simultaneous modes of collection and analysis for a STEM. IN some instances this analysis platform may be referred to as rapid advancement of capability-driven examination (RACE) platform (also referred to as a "RACE engine" or simply "RACE"), a "model," a "neural network" or merely "network," or "deep-learning model," and may be integrated with a STEM microscope. Embodiments of the disclosure include simultaneously collecting information over multiple modes of operation to reduce delays in data access and extraction. The development of RACE for examining materials using STEM may provide scientists and developers the ability to perform materials discovery using the STEM. Embodiments may process and report on the atomic structure of materials using STEM, where the phase and structure of the material may otherwise be unknown or a convolution of several phases. The typical STEM data may be extended and joined with accompanying point-resolved chemically sensitive images and computational modeling, which when quantified, overlaid, and correlated against one another may provide the user (e.g., a researcher and/or licensing agency) with the phase identification and accompanying data to qualify a specific material or process.

Disclosed herein are methods of expanding the use of deep learning for crystal structure determination based on diffraction or atomic-resolution imaging without apriori knowledge or ab-initio-based modeling. Of various machine learning models, such as Naïve Bayes, decision forest, and support-vector machines, convolutional neural networks may produce a model with the highest accuracy. To determine crystallography from these data types, convolutional neural network (CNN) may be trained to perform diffraction-based classification without the use of any stored metadata. The CNN model may be trained on a dataset including diffracted peak positions (e.g., simulated from over 538,000 materials with representatives from each space group). The growing potential for crystallographic structure predictions using deep learning for high-throughput experiments is assessed herein, augmenting an ability to readily identify materials and their atomic structures from as few as four Bragg peaks.

FIG. 1 is a block diagram of a material identification system 100, according to some embodiments. The material identification system 100 includes a material identification apparatus 102 and one or more sensors 104 (e.g., sensor 108, sensor 110, . . . , and sensor 112) operably coupled to the material identification apparatus 102. The sensors 104 are configured to generate sensor data 114 (e.g., sensor data 116 from sensor 108, sensor data 118 from sensor 110, . . . , and sensor data 120 from sensor 112) responsive to a material sample 130. The material identification apparatus 102 includes one or more data interfaces 106 and control circuitry 200. The data interfaces 106 are configured to receive the sensor data 114 from the sensors 104 and provide the sensor data 114 to the control circuitry 200 for processing.

The control circuitry 200 is configured to receive the sensor data 114 and provide predictions of identifications of the material sample 130, as well as certainty data indicating certainty levels of the predictions. For example, the control circuitry 200 may be configured to receive sensor data 116 generated by sensor 108 responsive to the material sample 130. The control circuitry 200 may also be configured to receive sensor data 118 generated by sensor 110 responsive to the material sample 130. The control circuitry 200 may further be configured to generate a first preliminary set of predictions of an identification of the material sample 130 and a corresponding first preliminary set of certainty information responsive to the sensor data 116. The control circuitry 200 may also be configured to generate a second preliminary set of predictions of an identification of the material sample 130 and a corresponding second preliminary set of certainty information responsive to the sensor data 118. The control circuitry 200 may be configured to narrow the first preliminary set of predictions based on the second preliminary set of predictions, the first preliminary set of certainty information, and the second preliminary set of certainty information to generate a set of predictions of the identification of the material sample and a corresponding set of certainty information. The set of predictions may be further narrowed responsive to sets of predictions and sets of certainty information corresponding to one or more additional sensors of the sensors 104.

The control circuitry 200 includes one or more processors 122 operably coupled to one or more data storage devices 124. The data storage devices 124 include one or more databases 126 including material information that is useful in identifying materials based on the sensor data 114. In some embodiments the material information includes, for a variety of different materials, diffraction data, chemistry data, image data, spectroscopy data, morphology data, feature size data, location data, other data, or combinations thereof. In some embodiments the material information includes peak distributions for a variety of material structures (e.g., peak distributions for families, genera, space groups, individual structures, etc.). The databases 126 include material identification information correlating with the sensor data 114 (e.g., by comparison of peak distributions derived from the sensor data 114 to stored peak distributions). By way of non-limiting example, the material identification information may include one or more of function of scattering angle information, reciprocal lattice spacing information, and chemical composition information.

The data storage devices 124 also include computer-readable instructions 128 stored thereon. The computer-readable instructions 128 are configured to instruct the processors 122 to perform operations that are useful in identifying materials based on the sensor data 114 and the information in the databases 126. By way of non-limiting example, the computer-readable instructions 128 may be configured to instruct the processors 122 to perform at least a portion of the method 300 of FIG. 3 (e.g., operation 306, operation 308, and operation 310). Also by way of non-limiting example, the computer-readable instructions 128 may be configured to instruct the processors 122 to perform at least a portion of functions of the control circuitry 200 discussed with reference to FIG. 2. As other non-limiting examples the computer-readable instructions 128 may be configured to instruct the processors 122 to operate according to the neural network architecture 1400 of FIG. 14 and/or according to the neural network 1600 of FIG. 16. The processors 122 are configured to execute the computer-readable instructions 128 to provide predictions of materials of the material sample 130 based on the sensor data 114 and the databases 126, as will be discussed in greater detail herein.

In some embodiments the control circuitry 200 is configured to provide the predictions of the identity of the material sample 130 in real-time responsive to reception of the sensor data 114 from the sensors 104. As used herein the term "real-time" refers to a processing duration of time that is sufficiently short to appear close to instantaneous to human perception. For example, substantially one second or less processing time may be considered "real-time" for purposes of the disclosure. Accordingly, processing time of the control circuitry 200 may be sufficiently fast to enable a user to modify measurement characteristics (e.g., operating settings of the sensors 104, position and/or orientation of the material sample 130 relative to the sensors 104, etc.) on the fly based on predictions provided by the control circuitry 200.

In some embodiments the material identification system 100 includes a STEM 132 including the sensors 104 and the material sample 130. The STEM 132 may be configured to operate the sensors 104 to at least substantially simultaneously generate the sensor data 114 to enable the control circuitry 200 to process the sensor data 114 from each of the sensors 104 at least substantially simultaneously. This simultaneous processing of the sensor data 114 from various sensors 104 may enable the control circuitry 200 to provide the predictions and corresponding certainty information in real-time relative to operation of the sensors 104.

In some embodiments the sensors 104 include one or more diffraction sensors (e.g., an x-ray diffraction apparatus, an electron based scattering diffraction apparatus, a selected area electron diffraction apparatus, a high resolution atomic scale scanning transmission electron microscope, other diffraction sensors, or combinations thereof). In some embodiments the sensors 104 may include one or more chemistry sensors (e.g., an energy dispersive x-ray spectroscopy apparatus, an atom probe tomography apparatus, a mass spectrometer, an electron energy loss spectroscopy apparatus, other chemistry sensors, or combinations thereof). In some embodiments, the sensors 104 may include one or more electron imaging sensors. In some embodiments, the sensors 104 may include one or more spectroscopy sensors (e.g., an x-ray spectroscopy apparatus, an electron energy loss spectroscopy apparatus, other spectroscopy sensors, or combinations thereof). In some embodiments the sensors 104 include a diffraction sensor and one or more of a chemistry sensor, an electron imaging sensor, a spectroscopy sensor, an additional diffraction sensor that is different from the diffraction sensor, or combinations thereof. In some embodiments the sensors 104 include a single sensor including a diffraction sensor, a chemistry sensor, an electron imaging sensor, or a spectroscopy sensor.

As the sensors 104 may include any of a variety of different types of sensors, the sensor data 114 may include any of a variety of different types of sensor data. For example, the sensor data 114 may include one or more different types of diffraction data, one or more different types of chemistry data, one or more different types of image data, one or more different types of spectroscopy data, or combinations thereof. As a specific, non-limiting example, the sensor data 114 may include diffraction data and one or more of chemistry data, image data, or spectroscopy data. As another specific, non-limiting example, the sensor data 114 may include two different types of diffraction data.

Figure 2:
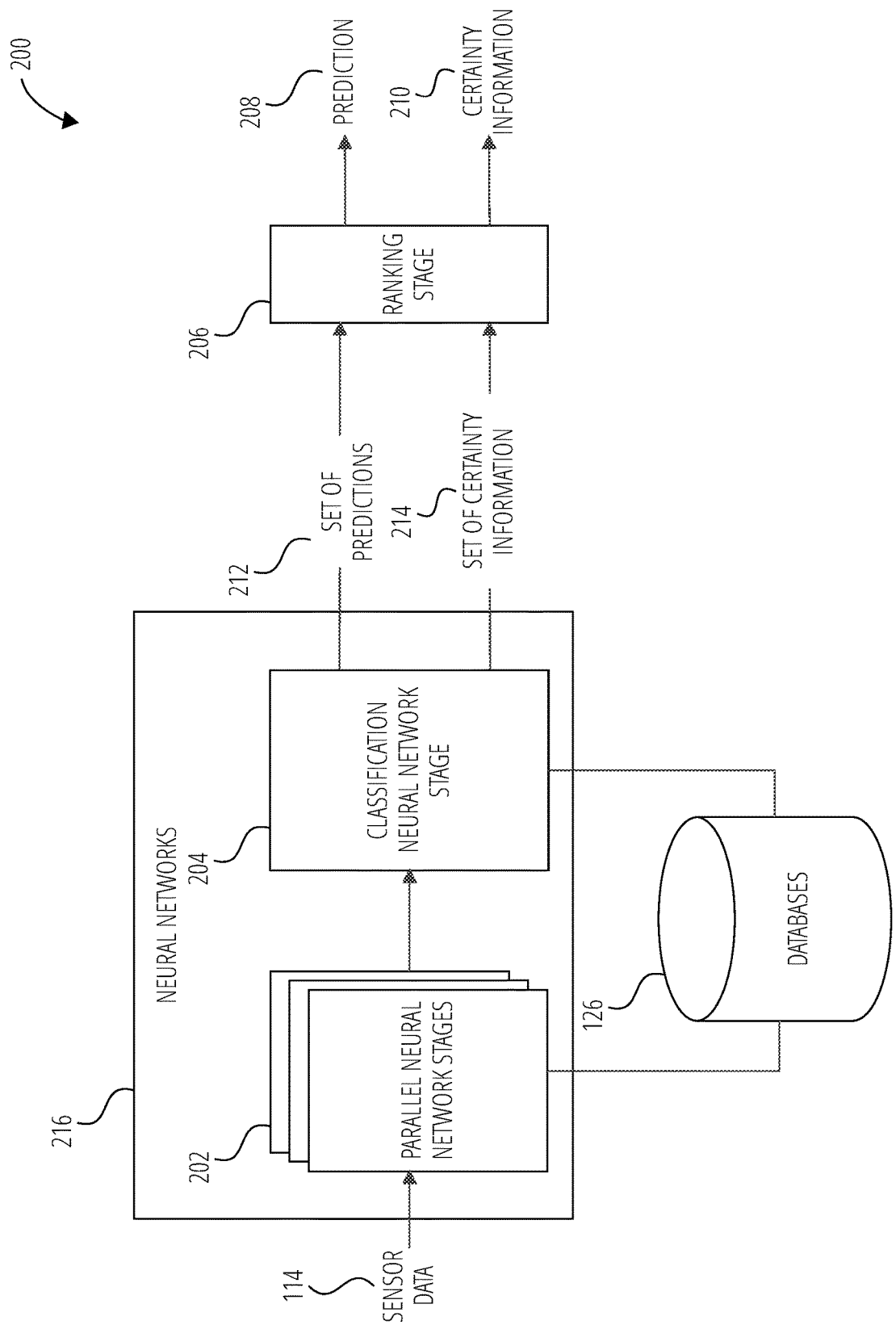
FIG. 2 is a block diagram of control circuitry of the material identification system of FIG. 1.

FIG. 2 is a block diagram of control circuitry 200 of the material identification system 100 of FIG. 1. The control circuitry 200 includes one or more neural networks 216 operably coupled to the databases 126 and a ranking stage 206. In operation the neural networks 216 are configured to receive the sensor data 114, provide a set of predictions 212 for identification of the material sample 130 (FIG. 1) and a set of certainty information 214 indicating levels of certainty of the predictions of the set of predictions 212. The neural networks 216 are configured to provide the set of predictions 212 and the set of certainty information 214 to the ranking stage 206.

The ranking stage 206 is configured to receive the set of predictions 212 and the set of certainty information 214 and rank the set of predictions 212 based on the set of certainty information 214. The prediction 208 is configured to select a prediction 208 (e.g., a highest ranking prediction) from the set of predictions 212 based on the ranking. The ranking stage 206 is configured to provide the prediction 208 and corresponding certainty information 210 indicating a level of certainty of the prediction 208.

The neural networks 216 are configured to flexibly adapt to the sensor data 114. For example, the neural networks 216 may include a plurality of parallel neural network stages 202. Each neural network stage of the parallel neural network stages 202 may be suited to process a certain type of sensor data 114. By way of non-limiting example the parallel neural network stages 202 may include one or more diffraction stages configured to process one or more types of diffraction data from one or more different types of diffraction sensors. Also by way of non-limiting example, the parallel neural network stages 202 may include one or more imaging stages configured to process one or more types of image data from one or more different types of image sensors. As another non-limiting example, the parallel neural network stages 202 may include one or more spectroscopy stages configured to process one or more types of spectroscopy data from one or more different types of spectroscopy sensors. As a further non-limiting example, the parallel neural network stages 202 may include one or more chemistry stages configured to process one or more types of chemistry data from one or more different types of chemistry sensors.

Based on one or more specific types of sensor data 114 received by control circuitry 200, one or more corresponding neural network stages of the parallel neural network stages 202 may be used to process the sensor data 114. By way of non-limiting example, if the sensor data 114 includes diffraction data and chemistry data, the control circuitry 200 may use a diffraction neural network stage and a chemistry neural network stage of the parallel neural network stages 202 to process the sensor data 114. Also by way of non-limiting example, if the sensor data 114 only includes sensor data 114, the control circuitry 200 may use only a diffraction neural network of the parallel neural network stages 202 to process the sensor data 114. As a further non-limiting example, if the sensor data 114 includes diffraction data, chemistry data, spectroscopy data, and image data, the control circuitry 200 may use a diffraction neural network, a chemistry neural network, a spectroscopy neural network, and an image neural network of the parallel neural network stages 202 to process the sensor data 114.

The neural networks 216 further include a classification neural network stage 204 configured to generate a set of predictions 212 of the material sample 130 and a corresponding set of certainty information 214 indicating a certainty of the set of predictions 212. By way of non-limiting example, the classification neural network stage 204 may produce predictions and certainty information corresponding to each type of sensor data (e.g., diffraction data, chemistry data, spectroscopy data, image data) of the sensor data 114, and narrow the predictions and certainty data to the set of predictions 212 and the set of certainty information 214 by processing all the different types of data as a whole.

To the extent that multiple different types of sensor data (e.g., diffraction data and one or more of chemistry data, spectroscopy data, image data, other diffraction data, etc.) are included in the sensor data 114 the classification neural network stage 204 may generate two or more preliminary sets of predictions and corresponding sets of certainty information for the various parallel neural network stages 202. As a result, by combining results from each of the parallel neural network stages 202, the set of predictions 212 and the set of certainty information 214 may be narrowed as compared to any of the preliminary sets of predictions and preliminary sets of certainty information.

The databases 126 include information that is helpful in identifying various different materials. In some embodiments, the databases 126 include crystal information files (CIFs). Information of the CIFs may be gathered from open materials and crystallography databases. For example, information for the CIFs may be acquired from Materials Project, Aflow, and Open Crystallography Database (OCD). Each of the CIFs may include information corresponding to a particular material. By way of non-limiting example, the CIFs may include crystals from all space groups in varying proportions. The CIFs may be used to generate a standard query language (SQL) database with relevant crystallography data associated with computed diffraction profiles as a function of scattering angle, reciprocal lattice spacing, and chemical composition information. The examples of the databases 126 may be discussed with reference to FIG. 5.

Figure 3:
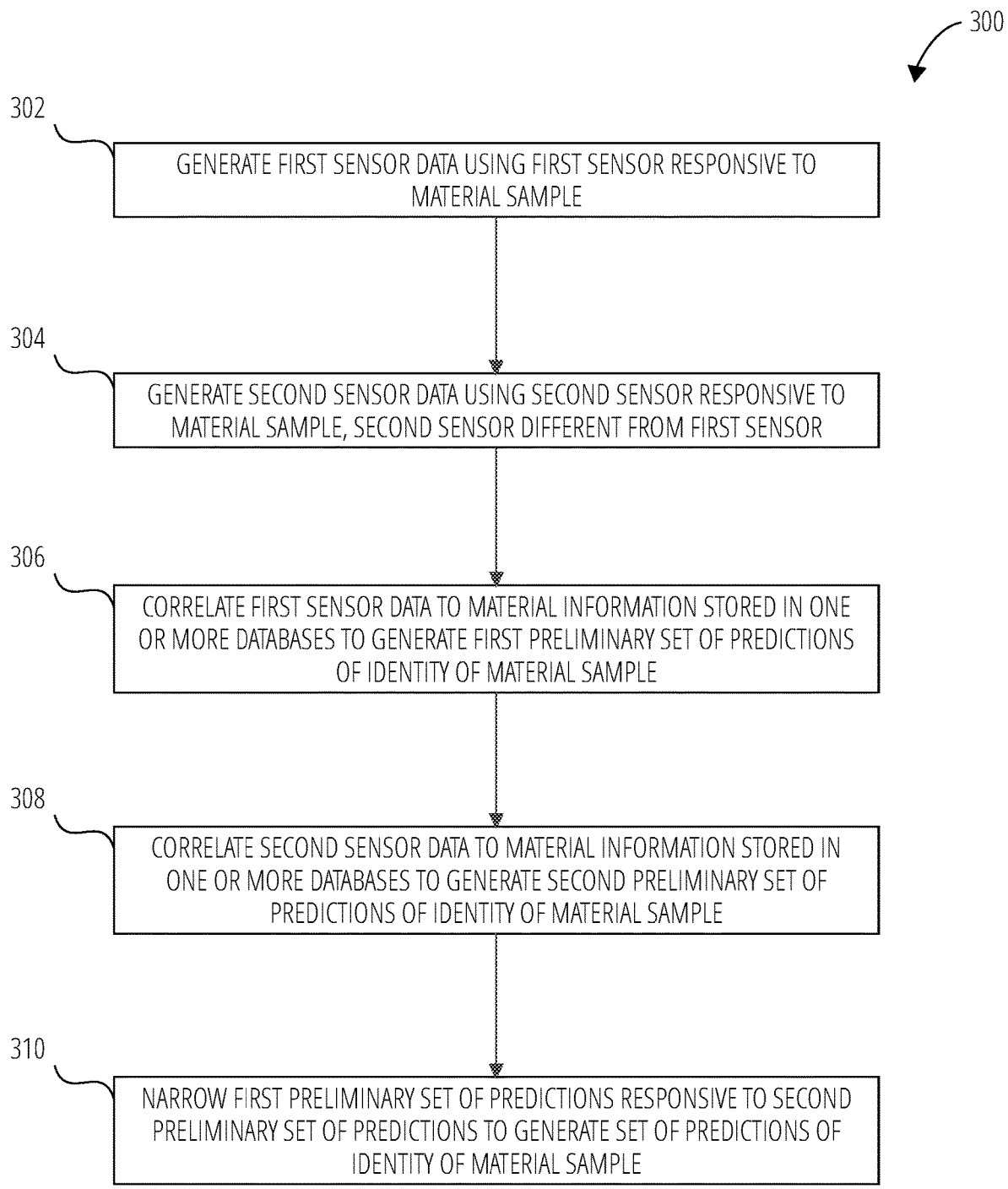
FIG. 3 is a flowchart illustrating a method of identifying a material sample, according to some embodiments.
Figure 4:
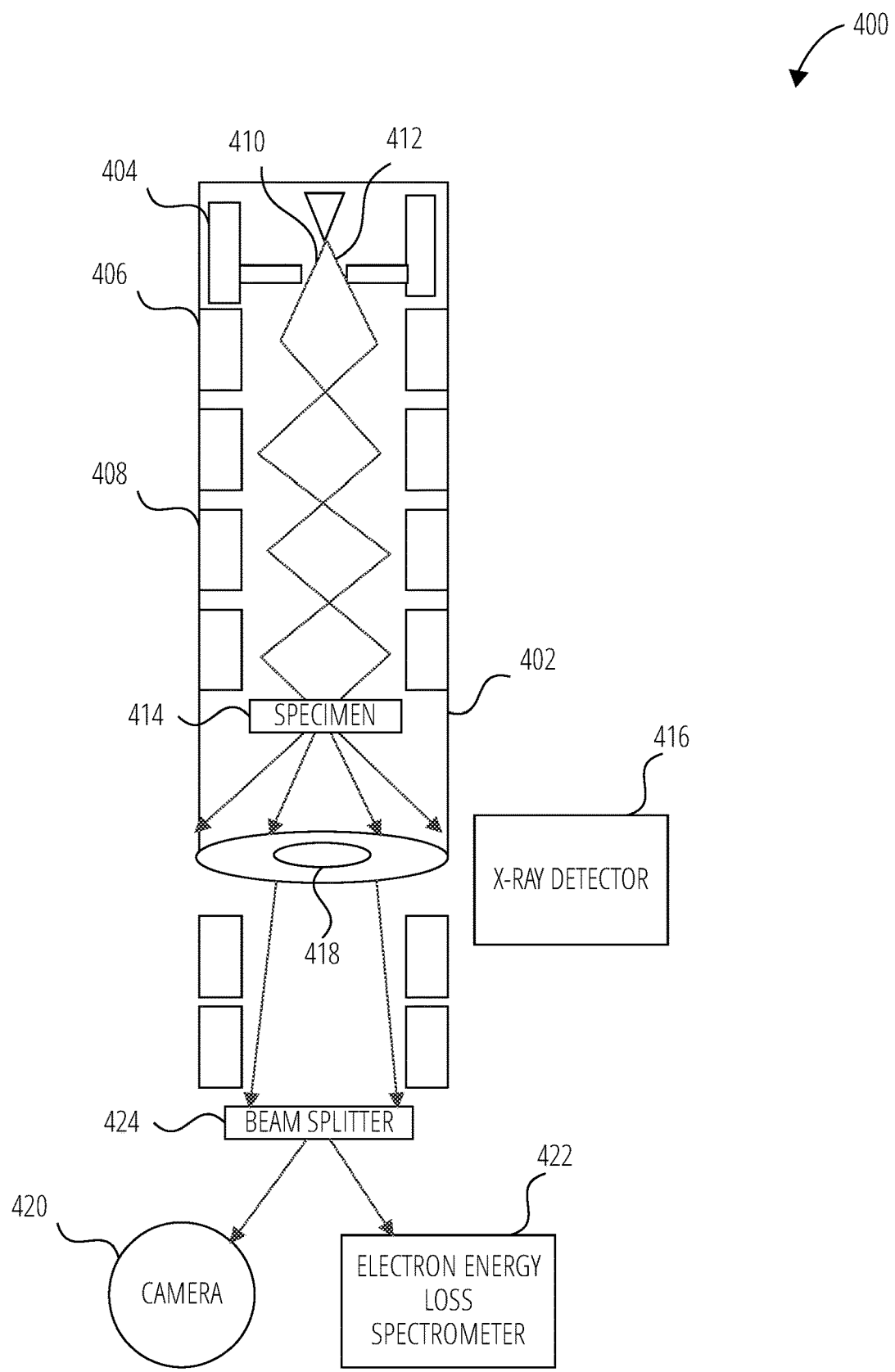
FIG. 4 is a simplified schematic diagram of a STEM, which is an example of a STEM of FIG. 1, according to some embodiments.

FIG. 3 is a flowchart illustrating a method 300 of identifying a material sample, according to some embodiments. In operation 302, method 300 generates first sensor data using a first sensor responsive to the material sample. In operation 304, method 300 generates second sensor data using a second sensor responsive to the material sample, the second sensor different from the first sensor. In operation 306, method 300 correlates the first sensor data to material information stored in one or more databases to generate a first preliminary set of predictions of an identity of the material sample. In operation 308, method 300 correlates the second sensor data to material information stored in one or more databases to generate a second preliminary set of predictions of the identity of the material sample.

In some embodiments correlating sensor data to material information stored in one or more databases (e.g., operation 306 and operation 308) includes generating a peak distribution based on the sensor data and comparing the peak distribution to peak distributions (e.g., the peak distributions of FIG. 6 through FIG. 12) stored in the databases. In some embodiments generating a peak distribution based on the sensor data includes generating a binary peak distribution indicating locations of peaks based on one or more peak thresholds.

In operation 310, method 300 narrows the first preliminary set of predictions responsive to the second preliminary set of predictions to generate a set of predictions of the identity of the material sample.

FIG. 1 is a simplified schematic diagram of a STEM 400, which is an example of STEM 132 of FIG. 1, according to some embodiments. The STEM 400 includes a housing 402 for the internal components including one or more electron guns 404, lenses 406, and scan coils 408. The electron guns 404 generate beams of electrons (e.g., beam of electrons 410 and beam of electrons 412) that pass through a specimen 414. Additional detectors may be incorporated with the STEM 400. The detectors may be selected from the group consisting of an x-ray detector 416, an annular dark field detector 418 (e.g., a high-angle annular dark field (HAADF) detector), a camera 420 (e.g., which may take measurements via a beam splitter 424) or other imaging device, an electron energy loss spectrometer 422, and any combination of any of the foregoing. Other detectors are also contemplated depending on the intended application.

One or more processors (e.g., the processors 122 of the control circuitry 200, one or more processors of the STEM 400 itself, other processors, or combinations thereof) may be configured to perform various operations in conjunction with the STEM 400. For example, the processors may be configured to perform and/or control operation, acquisition, and processing of simultaneous images, spectra, and diffraction patterns collected on the STEM 400. An additional RACE platform may bridge multiple gaps in nanoscale analysis that currently exist with conventional STEMs.

In particular, embodiments of the disclosure may control easily configurable multipoint resolved two-dimensional (2D) mapping in the STEM 400 where for each pixel (e.g., within 1 nm×1 nm or smaller) there is an associated indexable 2D diffraction pattern, a quantifiable energy dispersive x-ray or electron energy loss spectrum, and intensity contrast value provided by annular dark or bright field STEM detectors. Based on these inputs, the RACE platform may be configured to index materials to within the pixel resolution and quantify element specific chemistry. In addition, the RACE platform may be configured to combine crystallographic information and chemical composition to establish rapid materials discovery on the STEM based, at least in part, on the collected STEM data leveraging known techniques in big data mining and recovery.

Establishing the foundation for a materials discovery platform through the joint application of point resolved nanocrystallography and chemistry may ultimately provide a framework to rapidly advance the ability to identify nanochemistry, phases, trace impurities, and nanostructures in seemingly bulk materials from a variety of applications. Intuitively, the combination with computational tools such as density functional theory and atomic-based dynamics simulations on the effects of irradiation or the accumulation of fission products are eminent examples of what potential high-impact scientific discoveries and validations can be correlated in detail with ACE. As a result, STEMs may be improved to accelerate the scientific pace and reduce the need for expert-level familiarity with microscopy, crystallography, and providing the future with a foundation for a materials and scientific discovery for extended technical impacts on biology, chemistry, physics, material science, and energy sciences.

Materials research may be improved by enabling and combining multiple modes of operation inside a STEM to form a single all-encompassing materials dataset. Embodiments of the disclosure include enabling all modes available in the microscope to form a multimodal (e.g., multidimensional) dataset where combining chemistry and structure is natural. For example, the following operations may be performed and executed by the RACE platform integrated with the STEM 400.

By way of non-limiting example, one or more processors may perform a scan process, which may be set up including defining parameters such as dwell time, pixel size, frame time, readout frequency, and scan frequency. An initial STEM image may be collected for the sample. A beam path may be calculated, including computing an efficient pixel beam path based on the initial STEM image. A multidimensional imaging may be set up, including implementing a chosen beam path and input beam positions. A chosen path and positions may be implemented by a field-programmable gate array that controls the operation of the scan coils 408. Feedback control for the RACE platform may be performed, such as predicting the rate of drift and correcting the scan area.

Also by way of non-limiting example, one or more processors may enable detectors (e.g., x-ray detector 416, annular dark field detector 418, camera 420, electron energy loss spectrometer 422). Data may be captured by the different detectors. Such data may be combined into an $N^{th}$ dimensional data set containing data from the different detectors at a given point in time. The data may be combined and quantified, such as through image reconstruction, chemical & structure quantification of EDS, EELS, and diffraction data. The RACE platform may further perform combinatorial comparisons within the different information of the data set. The RACE platform may perform visualization of the data. For example, the various results may be evaluated using parallel processing and visualized on a display device. The display device may present a researcher with a user-friendly interface that displays data interpretation, data trends, and reports, such as regarding the origin or identity of a specific material and/or its properties.

As a result, the data extraction and access of cutting edge research tools may enable the combination of multiple modes of operation to extend attainable information without compromising time. The ability to render a single multi-dimensional dataset, including imaging, spectroscopy, diffraction, and chemistry may be an improvement over other microscopy applications. This improvement may be due to the RACE platform simultaneously acquiring images, spectroscopy, diffraction information, and/or chemistry information to enable a complete understanding of intricate atomic scale interfaces, defects, impurities, and generalized features. Such information is often responsible for measureable differences in electronic, mechanical, thermal, and physical properties of materials.

In nuclear materials research, nuclear fuels and advanced metallurgical alloys may benefit from a combined multi-modal approach, where using a precision controlled atomic-size (e.g., Angstrom-size) electron beam with minimal distortion may be utilized to report radiation induced features, such as stacking faults, dislocations, phases, and diffusion to the atomic scale without compromising information. For example, embodiments of the disclosure may be applied to understand the role of material defects, interfaces, and phases associated with advanced claddings (e.g., oxidedispersion alloys and MAX phases), fuel (e.g., U-Mo, UO2 dispersion fuel), and spent nuclear fuel and waste products (e.g., 137CsCl, 90SrF) to inform multiple material campaign efforts, including those related to the nuclear fuel cycle, advanced fusion reactors, and accident tolerant reactor technologies.

As another example, samples (e.g., xenon-irradiated samples such as in the superlattice of uranium-molybdenum fuel or as solid state precipitates in high temperature aluminum) may be used by the STEM to develop routines for not only reliably differentiating chemistry at the nanoscale, but also calculating combinatorial differences in atomic ordering that are easily predicted thru density functional theory calculations and molecular dynamics simulations.

By enabling simultaneous imaging, spectroscopy, and diffraction modes in the STEM 400, structural and chemical information is naturally merged into a single multi-dimensional dataset. Based on the natural formation of this multi-dimensional dataset, different types of data (e.g., structure, chemistry, morphology feature size, location, etc.) may be quantified, overlaid, joined, and compared against one another without complications of scale, size, or field of view. A user-friendly multiplatform software may be configured to combine and accelerate data collection, quantification, and provides a foundation for materials exploration, validation, and discovery. Embodiments of the disclosure may be applied to various industries including nuclear, materials, microscopy (e.g., microscopy examinations), and other scientific industries using analytical instruments such as STEM.

The RACE platform architecture is configured to handle and process images, spectra, and diffraction patterns collected on the STEM 400. Based on results a modeling module may validate results. For example, the RACE engine (e.g., the control circuitry 200 of FIG. 1 and FIG. 2) may be configured to perform various operations such as advanced mathematics and statistics, peak and function fitting, component mapping, machine learning, and automation. In addition, the RACE engine may receive information from the various modes of operation that may operate substantially simultaneously. These modes may include materials modeling configured to perform phase field modeling, first principles modeling, atomistic modeling, and advanced crystallography. A diffraction analysis may include phase and material identification, orientation mapping, and texture analysis. An imaging analysis may include image sizing, and feature segmentation. A spectroscopy analysis may include energy dispersive x-ray spectroscopy, and an electron energy loss spectroscopy.

In some embodiments, the engine and modes may be configured as open-access extensions to an open-platform for a STEM, whereas other embodiments may be configured as a standalone product (e.g., in Java, Labview, Matlab/Simulink, Python-based programming suites, etc.). In some embodiments, the RACE platform may be integrated into existing STEMs (e.g., by retrofit). As a result, the addition of specific physical and signal hardware may be added separately to the STEM, such as smaller size condenser apertures, field programmable gate arrays, and multifunction I/O modules to interface with the beam position and simultaneous signals. In some embodiments, the RACE platform may be integrated within STEMs at the outset during initial design and manufacture such that additional components may simply be incorporated at the outset prior to being set up with a customer.

Implementation of a RACE platform architecture using machine learning may, in one embodiment, employ a neural network for determination of crystal structure based on diffraction and/or atomic-resolution imaging.

In one example the STEM 400 and RACE platform may be used to study a zirconium hydride alloy including heterogeneous samples containing hydride platelets that may be studied in detail with imaging, diffraction, spectroscopy, chemistry information, and validated by phase field modeling.

In one example the STEM 400 and RACE platform may be used to study bimodal samples that have been Xenon (Xe) irradiated including uranium-molybdenum (U-Mo) alloys and room temperature aluminum (Al) to combine structural and chemical information at the atomic level to perform phase identification and mapping.

In one example the STEM 400 and RACE platform may be used to study interplanetary space dust where, based on the information gained, highly impactful insights on the origins of the early solar system may be provided. The collected interplanetary space dust and meteorites may be from the NASA Stardust mission. These early universe samples are highly scientifically valued for their origins and may provide the ultimate test in the ability to report on the elemental speciation and presence of unknown phases caused by background cosmic radiation on the origins of early life on Earth.

In one example various data sets from the STEM 400 may be analyzed by the RACE engine and examples of different deliverables may be displayed to the user. For example, the RACE engine may receive a sample morphology dataset of oxide dispersion strengthened alloy with Ti and Cr containing precipitates, and perform advanced image segmentation to differentiate particles and grains, and particle counting, to generate an image showing segmented grains based on the STEM image. In another example, the RACE engine may receive a material structure dataset of a bright field image taken from a grain interior. The RACE engine may perform particle size counting, structural mapping, and a strain analysis to generate decomposed structural FFTs of the Fe-CR matrix and the particles.

In another example, the RACE engine may receive a material chemistry dataset of a STEM-based electron energy lost spectroscopy for various elements (e.g., Ti, Fe, O, Cr). The RACE engine may perform advanced spectral analysis applied to electron energy loss spectroscopy, quantified maps, uncertainty analysis, principal component analysis, phase decomposition, and visualization to generate relative atomic composition maps and an accompanying high resolution image. In another example, the RACE engine may receive a 3D imaging dataset such as an x-ray based tomographic image of a graphite block. The RACE engine may perform segmentation of features and 3D visualization to generate an advanced 3D composition and structural map of the granulates and particles.

Figure 5:
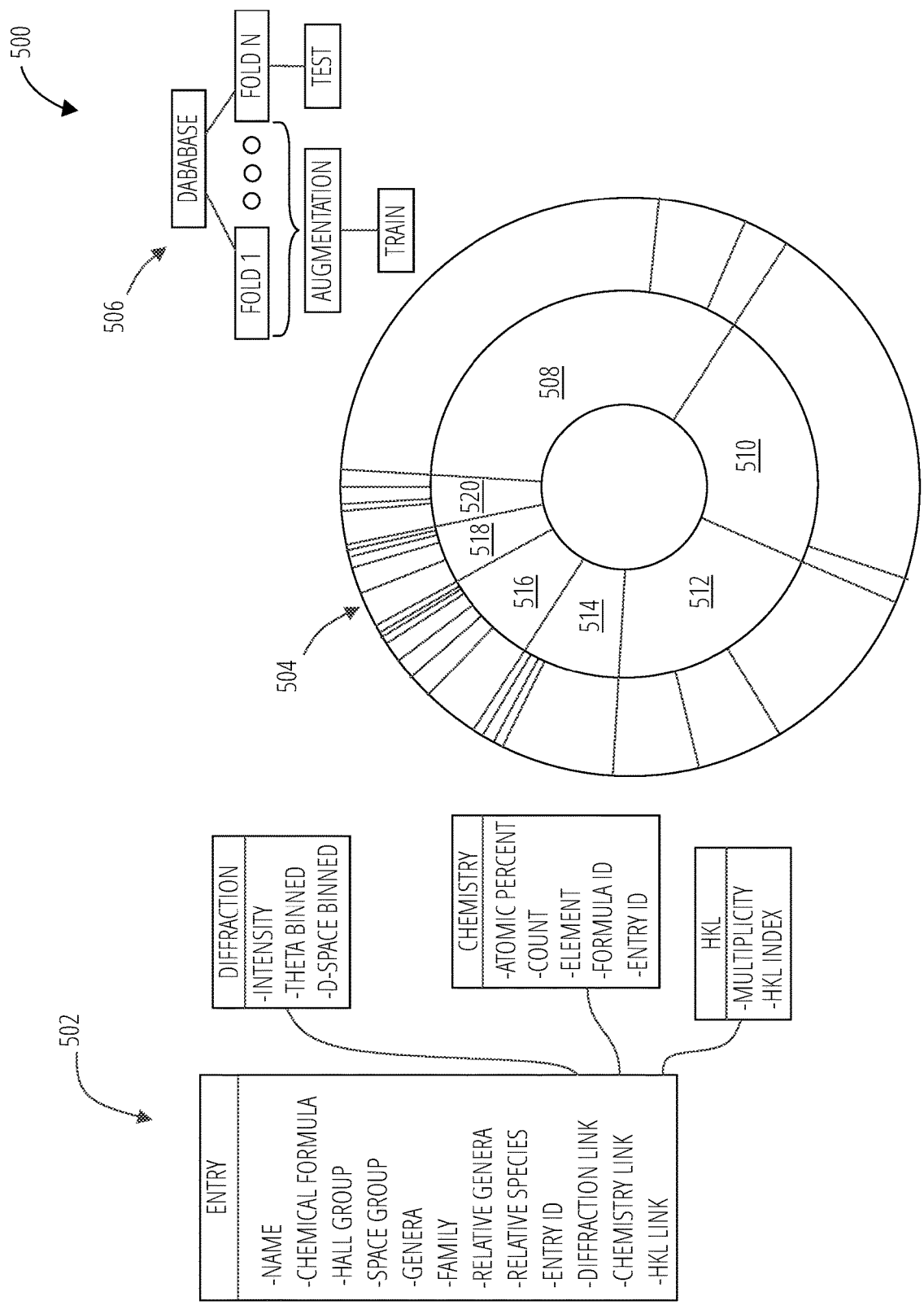
FIG. 5 illustrates a schematic for materials data and structure of a database, which is an example of databases of FIG. 1 and FIG. 2, according to some embodiments.

FIG. 5 illustrates a schematic for materials data and structure of a database 500, which is an example of databases 126 of FIG. 1 and FIG. 2, according to some embodiments. FIG. 5 illustrates a structure 502, a relative composition pie diagram 504, and a data allocation diagram 506 of the database 500. In the database 500, a pre-simulation dataset includes 572,000 CIFs. Additional CIFs (e.g., from the inorganic crystal structure database (ICSD)) for underrepresented space groups were provided to provide further examples. The CIFs were then used to generate an SQL database with relevant crystallography data associated with computed diffraction profiles as a function of scattering angle, reciprocal lattice spacing, and chemical composition information.

The structure 502 of the database 500 indicates the structure used to create and store the training set. For example, each entry of the database 500 includes information indicating a name, a chemical formula, a Hall group, a space group, a genera, a family, a relative genera, a relative species, an entry identification, a diffraction link, a chemistry link, and an HKL link. The diffraction link information includes information regarding intensity, theta binned, and D-space binned. The chemistry information includes information regarding atomic percent, count, element, formula identification, and entry identification. The HKL information includes information regarding multiplicity and HKL index.

The relative composition pie diagram 504 illustrates an allocation of the database 500 to each crystallographic family, genera and species. For example, each entry of the structure 502 may be directed to a genera of the relative composition pie diagram 504. The genera of FIG. 16 include a monoclinic 508, a triclinic 510, an orthorhombic 512, a cubic 514, a tetragonal 516, a trigonal 518, and a hexagonal 520 genera. The relative composition pie diagram 504 illustrates an abundance (e.g., the monoclinic 508 genera, the triclinic 510 genera) and a scarcity (e.g., the hexagonal 520 genera, the trigonal 518 genera) of certain genera in the database 500. An abundance or scarcity of certain families may also be present.

The data allocation diagram 506 illustrates data allocation during the different folds (e.g., fold 1 through fold N) during training and testing for cross-validation. Fold 1 through fold N−1 may be associated with augmentation and training. Fold N may be associated with test.

Fingerprints for any material based on crystal geometry, underlying atomic coordination, and occupancy may be encoded into a diffraction profile. Under the influence of an impinging x-ray and destructive interference neutron or electron results in a series of peaks in scattered intensity where there is destructive interference, forming a two-dimensional diffraction pattern. Pending on scattering geometry one specific pattern is generated per sample orientation, where a single crystal for one orientation will show a series of identifiable peaks in reciprocal space. Filling in all reciprocals requires a highly polycrystalline sample or alternatively a sample that is processed through all sample orientations and diffracting conditions completing the Ewald sphere where all diffraction peaks can be identified and readily indexed. For the purposes of classification, all orientations and identifiable peaks are input into the model. Chemistry may be input into the model as an additional descriptor. Presence of specific elements and composition may be implemented as additional search terms for structure or may be used to further parse potential structures from classified models.

The CIFs may be checked for consistency and proper formatting. CIFs that are missing structures, chemical formulas, or whose symmetry operations are inconsistent with their space group may be removed from the training set. The removal may be performed consistent with established sets of crystallographic rules and classes. CIFs missing one essential field, such as structure, may often also be missing other fields. After checking the CIFs for formatting, diffraction profiles may be simulated (e.g., using Python Materials Genomics (PyMatgen)). The spectra may be converted into a single feature vector by thresholding peaks based on their relative intensity compared to the highest peak in each signal. Profiles that contain no peaks in a range between 0.50 and 6 Angstroms may also be removed from the training set. Remaining spectra may then be stored in a SQL database with labels for family, genera, species and chemistry. In the example of the database 500 the cleaned training set included 431,000 spectra and associated chemical metadata, including composition.

Simplifying the representation of diffraction and chemistry allows for a broader set of data acquisition methods. Whether the input (e.g., sensor data 114 of FIG. 1 and FIG. 2) is a Fourier transformed high resolution atomic scale image, or diffraction profile acquired using electrons, neutrons, or X-rays the relevant atomic scattering peaks are positioned with respect to their crystallographic scattering position in reciprocal space. A classification model therefore that considers peak position alone in reciprocal space is impervious to changes in technique. Training data was therefore built from CIFs and simulated a wealth of available features to train models. For example, a minimalist representation may represent features that are expected to be present in the widest range of acquisition methods. For diffraction, the profile may be reduced to a vector of peak locations. Peaks may be represented in the vector as 0 if no peak was detected and 1 if a peak was detected. The peaks may be divided into 900 bins uniformly partitioning the range from 0.5 to 6 Angstroms in reciprocal d spacing. This range may accommodate a wide selection of microscopes and hardware. The number of bins may have sufficient but not excessive granularity based on the underlying resolution of 0.1 Angstroms, which is below the experimental uncertainty of 0.3 Angstroms in reciprocal spacing. By imposing fewer requirements and assumptions on the model inputs a generalized model may be created. Chemistry may be input as a feature vector containing element listing and computed atomic compositions.

In addition to the simulated diffraction profiles, a set of augmentation operations may be defined on the data set to be used during training to further bolster the training data including relative peak assignment uncertainty of 0.3 Angstrom, in reciprocal space. The uncertainty may be chosen based on the level of common refinement methods and sources.

Neural networks may rely on larger training sets than other machine learning algorithms. In order to address both the scarcity and imbalance of rarer classes of materials in the databases (e.g., databases 126, database 500), a set of functions that would mimic data collected within an experimental setting may be defined. For example, two augmentations for the diffraction input and one for the chemistry may be defined. The functions may be chosen to replicate experimental variations that are plausible across all data acquisition modalities.

Diffraction augmentation accounts for variations within camera calibration and peak localization methods. Peak positions may be shifted by a number of bins drawn from a normal distribution centered at zero with a variance of 1.5 bins, where the width of a bin is equal to 0.006 1/Angstroms. The range of possible shifts may be chosen to account for differences in binning method, centering of experimental data, and dispersion variation over the entire input profile.

For atomic percentage a composition may be allowed to change by up to 5 atomic % (at. %) or 5 parts per million (ppm) to mimic the experimental uncertainty amongst common methodologies. Methods for chemical composition analysis of materials include energy dispersive x-ray spectroscopy (EDS), atom probe tomography (APT), mass spectrometry (MS), and electron energy loss spectroscopy (EELS). Pending quantified standards that calibrate the results of these techniques there is upper uncertainty bound of 5 at. %, where this value has been implemented into the model to cover a significant range and higher ablation value. With higher certainty the statistics lends itself to improved classification, where potential for higher background is captured for higher ablation.

A robust processing pipeline may be developed for different collection modalities of diffraction to create the feature vector for model input. Two-dimensional diffraction data may be azimuthally integrated to create a profile in pixel space used alongside calibration settings to determine the d-spacing of the peaks. To detect peak positions in reciprocal spacing, profiles may be processed through a max voting algorithm. The voting algorithm may or may not use a background subtraction to fit peaks. The voting algorithm may instead utilizes a max polling variational profile to define a rising feature as a peak. The detected peak locations may be binned and cataloged by position. Chemistry data may be implemented as a simple binary vector to capture the presence of elements in a material and if available, a vector of atomic percentage.

In another example, approximately 650,000 individual structures were screened for duplicates or other potential errors. A weighting schema was applied for each class and assigned to address the occurrence of overly represented crystal types, noting substantial imbalances amongst populated crystal families, groups, and space groups ranging from 136,534 to less than 1,000. The aggregate accuracies and population statistics for each level of the hierarchy are reported in Table 1.

TABLE 1

|  | Accuracy (%) | Population |
|---|---|---|
| Triclinic | 91.04 | 105,200 |
| pedial | N/A | 16,740 |
| pinacoidal | N/A | 88,460 |
| Monoclinic | 86.73% | 217,156 |
| sphenoidal | 86.50% | 21,705 |
| domatic | 74.95% | 14,997 |
| prismatic | 90.14% | 180,454 |
| Orthorhombic | 75.75% | 104,526 |
| rhombic-disphenoidal | 77.18% | 22,182 |
| rhombic-pyramidal | 92.32% | 19,722 |
| rhombic -dipyramidal | 67.42% | 62,622 |
| Tetragonal | 84.81% | 40,770 |
| tetragonal-pyramidal | 65.80% | 1,081 |
| tetragonal-disphenoidal | 76.46% | 1,437 |
| tetragonal-dipyramidal | 96.23% | 5,112 |
| tetragonal-trapezohedral | 82.99% | 2,373 |
| ditetragonal-pyramidal | 88.16% | 1,450 |
| tetragonal-scalenohedral | 84.22% | 4,309 |
| ditetragonal-dipyramidal | 81.14% | 25,008 |
| Trigonal | 82.78% | 31,252 |
| trigonal-pyramidal | 81.48% | 3,499 |
| rhombohedral | 90.46% | 6,017 |
| trigonal-trapezohedral | 94.13% | 2,321 |
| ditrigonal-pyramidal | 82.90% | 5,831 |
| ditrigonal-scalenohedral | 89.43% | 13,584 |
| Hexagonal | 86.07% | 24,147 |
| hexagonal-pyramidal | 88.17% | 1,828 |
| trigonal-dipyramidal | 90.14% | 453 |
| hexagonal-dipyramidal | N/A | 2,100 |
| hexagonal-trapezohedral | 99.24% | 930 |
| dihexagonal-pyramidal | 92.01% | 2,969 |
| ditrigonal-dipyramidal | 95.36% | 3,230 |
| dihexagonal-dipyramidal | 93.64% | 12,637 |
| Cubic | 95.47% | 48,289 |
| tetartoidal | 96.75% | 1,842 |
| diploidal | 90.56% | 1,389 |
| gyroidal | 93.68% | 737 |
| hextetrahedral | 97.14% | 6,475 |
| hexoctahedral | 87.29% | 37,846 |

Crystal files were labeled by family, genera, and species. The corresponding label was used for different levels of the hierarchy to train and evaluate models. Table 1 summarizes the population and accuracy overall in seven crystal classes and 32-point symmetry groups. Each file generated a distinct diffraction profile as a function of the corresponding Bragg angle, utilizing crystal structures. Interplanar d-spacings were generated at each level of the hierarchy to train the model. The resolution in the individual binary signal, including a normalized vector of intensity against the Bragg angle, was set to 0.5°.

Out of 571,340 total structures stored in the database 500 at the family level, over 136,534 randomly chosen structures were evaluated at the family level and the genera level to evaluate the model (e.g., neural networks 216 of FIG. 2). When compared at the genera level, cubic and orthorhombic confusion matrices illustrate the hierarchy and classification scheme issues of imbalance in the data despite the weighting during training. This example highlights the classification hierarchy analogous to nested network architecture capable of predicting structure at the family, genera, and space group levels.

As previously mentioned, initially there were approximately 650,000 structure-based files that were cleaned and simulated. The files were screened for formatting errors, missing essential information, and simulation errors. The files were used to simulate diffraction profiles while they were checked against the CIF file to ensure proper simulation. The profiles were further refined to a binary signal of peak positions. The simulated signals contained several prominent peaks and dozens of lesser peaks that may not be present in all experimental settings and differed between electron, X-ray, and neutron experiments. In the case of electron microscopy, the intensity does not necessarily scale against known structure factors and is strongly affected by material texturing. For full-scan X-ray and neutron data in which the intensities scale against known structure factors, an applied threshold was used to remove peaks below the signal-to-noise ratio to seed the prediction with fewer peaks leads to predicting crystal with a high degree of accuracy (e.g., well above 80%). The prominent diffraction peaks are the most reliable indicator of the structure. The previous crystallography analysis tools further corroborate the model. Based on a binary representation of the data as a function of peak position, the hierarchical model was trained on signals for each family and genera, removing peak intensity as a variable, which simplifies the representation.

Moving to the binary representation of peak positions eliminated the intensity of the peaks and allowed the models to be applied to several diffraction-based modalities. A simulated diffraction profile includes lattice spacings as a function of either Angstroms or integrated Bragg. Due to constraints on the number of learnable parameters, the Bragg angle resolution was 0.5°. Based on a survey of peaks at 0.5°, it is a reasonable resolution for classification in the cases of 60 to 300 kV electron beams, typically operating voltages of modern electron microscopes.

If space group classifications may be learned from peak locations alone, aggregate signals for each family, genera, and species may be summed across all members and quantitatively compared. The aggregate peak distribution signals for triclinic, monoclinic, orthorhombic, and cubic families are plotted against two theta values in FIG. 6 through FIG. 12. The peak distributions for each family, genera, and species may be stored in the database 500 for comparison to material sample peak distributions generated from sensor data (e.g., the sensor data 118) to identify a material sample (e.g., material sample 130). For example, a peak distribution for the material sample may be generated based on diffraction data, image data, chemistry data, spectroscopy data, or combinations thereof. The peak distribution for the material sample may be compared against peak distributions (e.g., those of FIG. 6 through FIG. 12 and others) to identify a family, genera, and species of the material sample. As a specific, non-linear example, a least squares regression may be used to compare the material sample peak distribution to the various peak distributions stored in the database 500 to determine which stored peak distributions are closest to the material sample peak distribution at various levels (e.g., the family, genera, and species levels).

FIG. 6 through FIG. 12 are plots of peak distributions over genera or families at each level to uniquely differentiate notable features. At the family level of the hierarchy, significant overlaps in distributions and similarities among genera caused predictions among families to be unreliable. Once the family of the crystal is determined, prediction accuracies rise into the 80-98% range.

In some embodiments the database 500 is configured to store a peak distribution for each structure stored in the database (e.g., 571,340 peak distribution signals for 571,340 structures). The peak distribution signals are not uniformly distributed amongst all classes at any level of the hierarchy. There is a strong preference for higher-symmetry structures within the seven crystal families at the genera level, but there does not appear to be a preference at the space group level. The model was trained on the materials contained within each database. The disparity in membership between classes introduces challenges into training deep-learning models.

Datasets that are highly imbalanced are susceptible to mode collapse. In such a case, predicting the most common class yields a high accuracy without discriminating between materials. To counteract the imbalance present in the crystallographic data, a weighting schema may be imposed in training. During training, the relative presence of classification was used to compute a weight that would be applied during the loss calculation. The weight may be defined as the ratio of the total number of structures per space group over all space groups. The same weighting schema may be performed at the point group level.

In cases where the dataset is relatively balanced, the number of examples in each class may be within the same order of magnitude; the weights may be similar enough that they do not significantly bias the model. When a dataset is highly imbalanced, the number of examples in each class may differ by more than an order of magnitude. This schema may penalize the model for incorrectly predicting a rarer space group more harshly than it rewards the model for correctly predicting a common space group. Weighting the rare classes to be more important to the model during training had an ameliorating effect on the data imbalance but does not eliminate it. Models trained without this weighting schema suffered mode collapse and would not predict rare classes. To account for and further mitigate mode collapse from data imbalance, models were trained on top-one accuracy but evaluated on top-two accuracy. Misclassifications are predominantly to the common class, and top-two accuracy of the ranked predictions allows the model, in many cases, to correct for misclassifications due to imbalances in the data. The relative score from the output of the SoftMax layer determines the rank order. The confidence in the ranked prediction is based on the model accuracy during testing, not the relative score.

Initial test models showed that attempting to classify directly to species produced models with poor accuracy and compounding effects from mode collapse. Utilizing a hierarchical model that assumes family, then predicts genera, then species leads to higher accuracy at each step. Even with cascading error the method is substantially more accurate. Comparing the confusion matrices from each family highlights a high level of accuracy.

Figure 6:
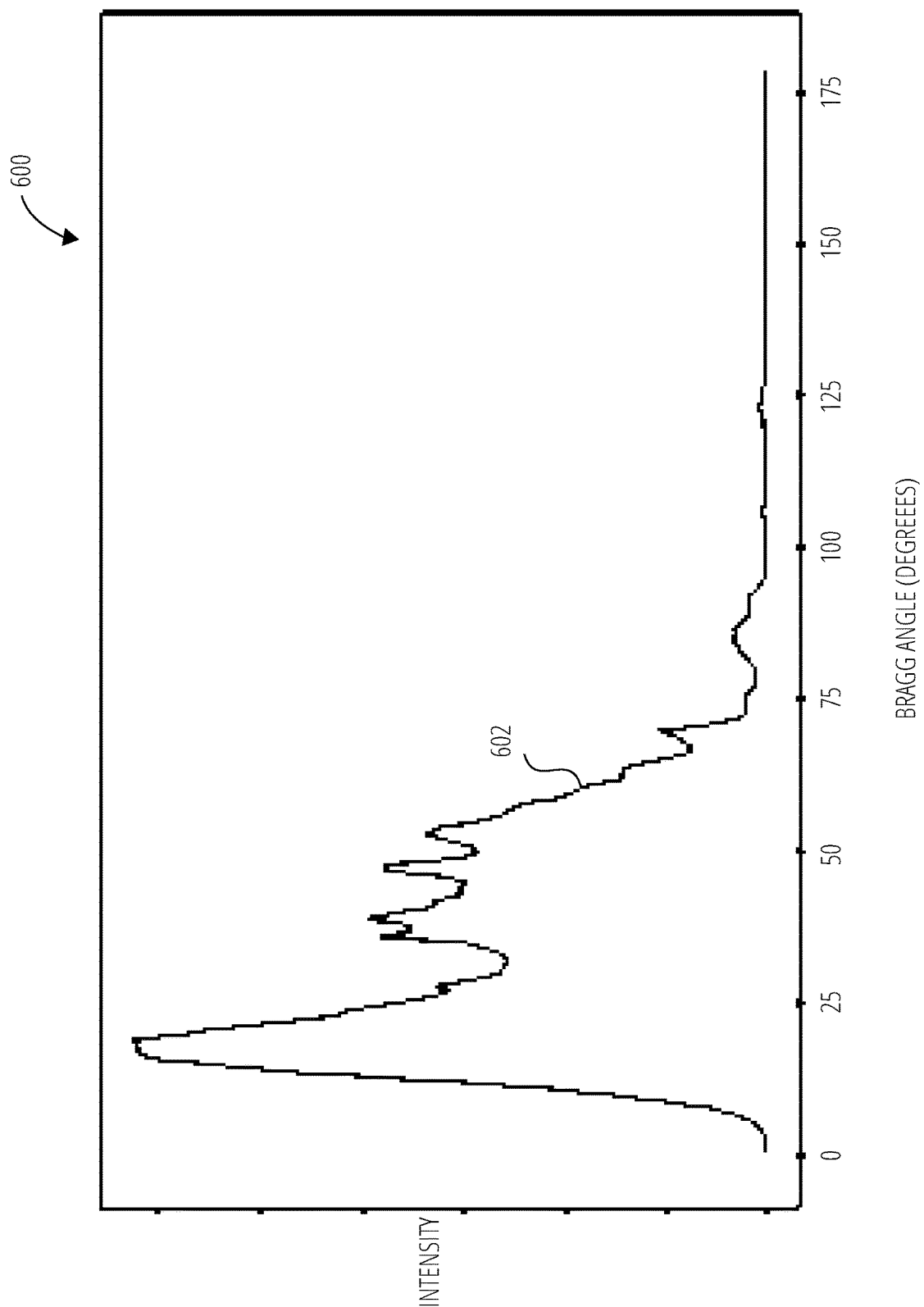
FIG. 6 is a plot of a peak distribution of family 1, according to some embodiments.

FIG. 6 is a plot 600 of a peak distribution 602 of family 1, according to some embodiments. In family 1 membership was 105,200 members. An average number of peaks of the peak distributions of the members of family 1 was about 3.79 peaks.

Figure 7:
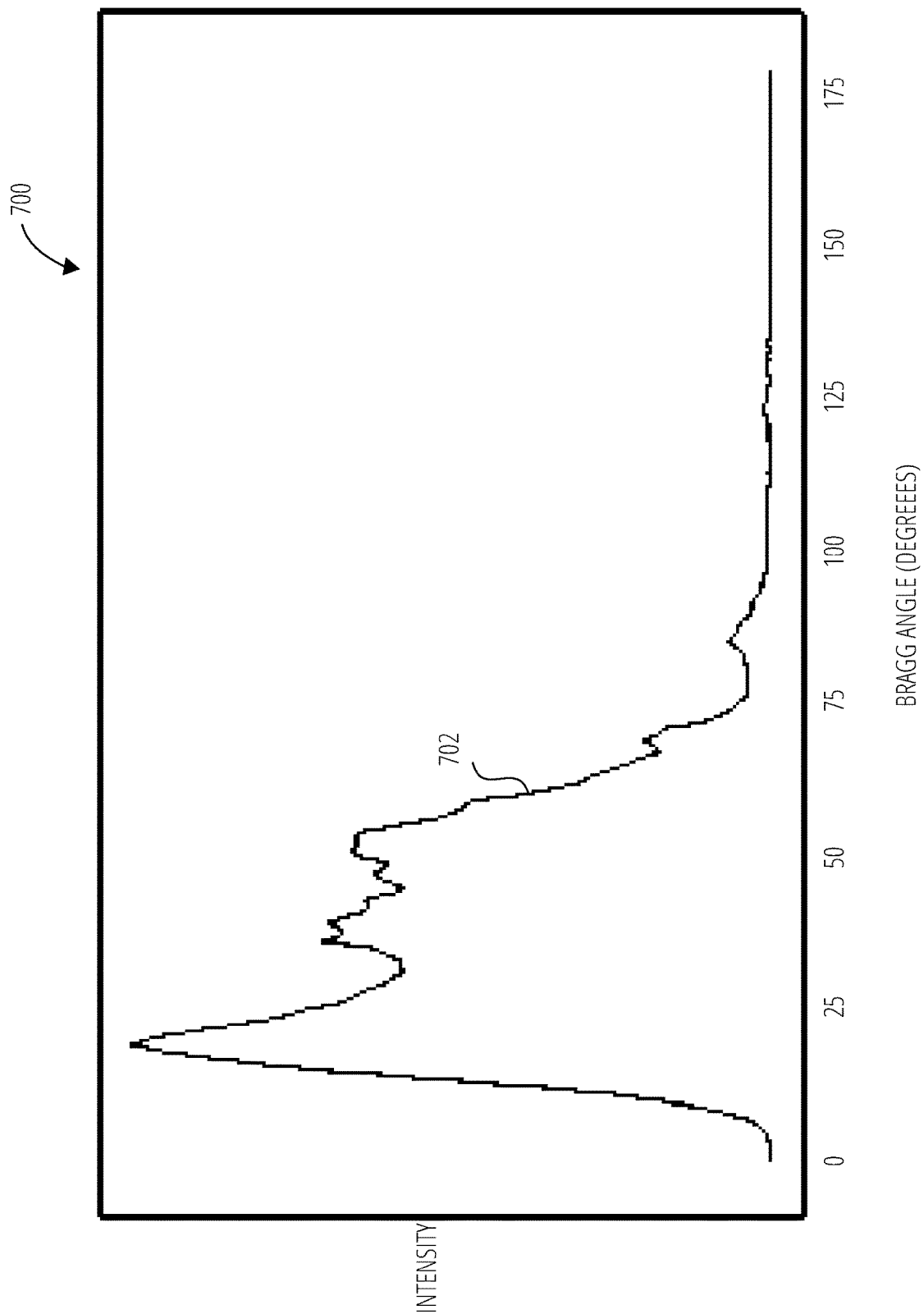
FIG. 7 is a plot of a peak distribution of family 2, according to some embodiments.

FIG. 7 is a plot 700 of a peak distribution 702 of family 2, according to some embodiments. In family 2 membership was 217,156 members. An average number of peaks of the peak distributions of the members of family 2 was about 3.37 peaks.

Figure 8:
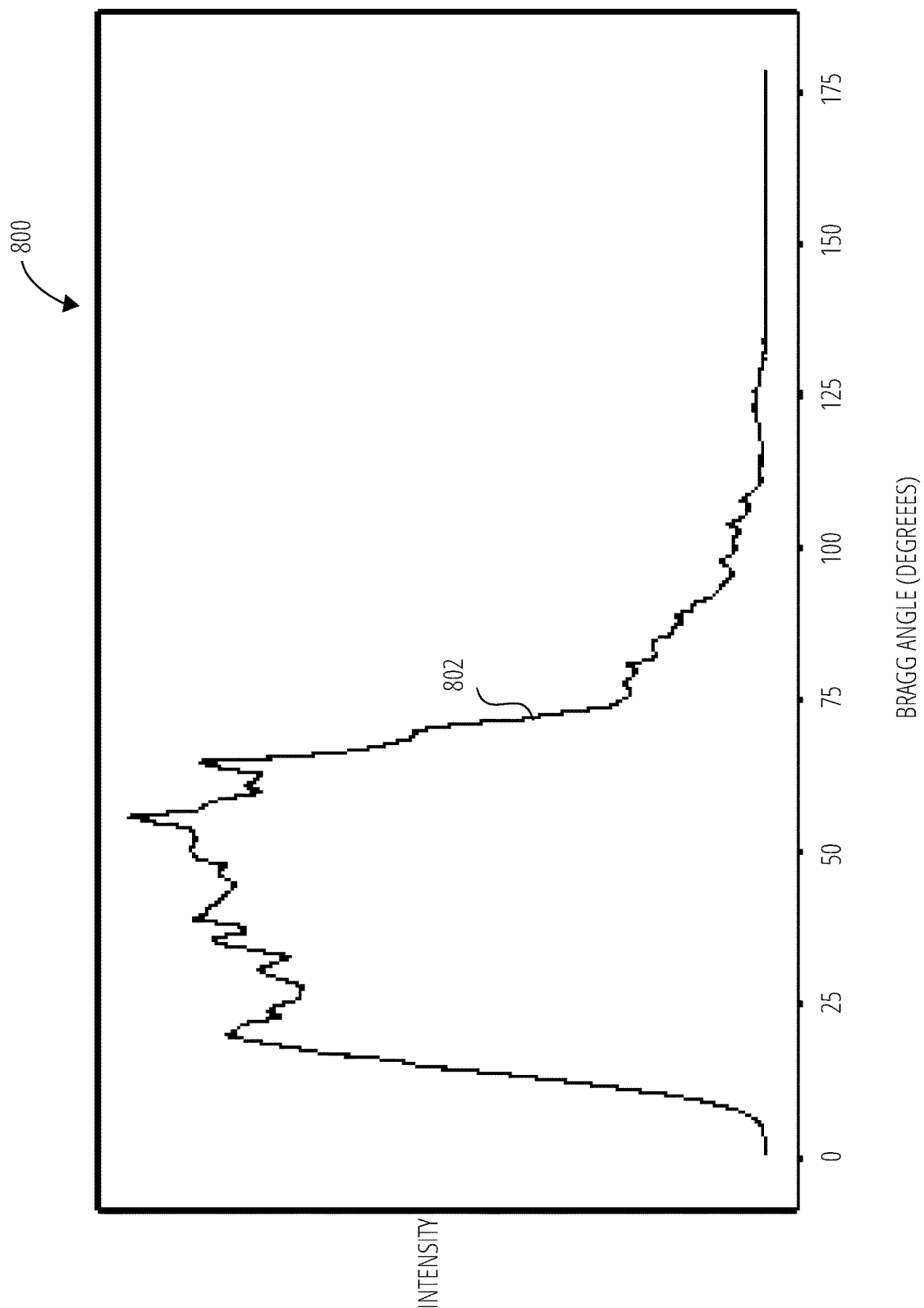
FIG. 8 is a plot of a peak distribution of family 3, according to some embodiments.

FIG. 8 is a plot 800 of a peak distribution 802 of family 3, according to some embodiments. In family 3 membership was 104,526 members. An average number of peaks of the peak distributions of the members of family 3 was about 3.15 peaks.

Figure 9:
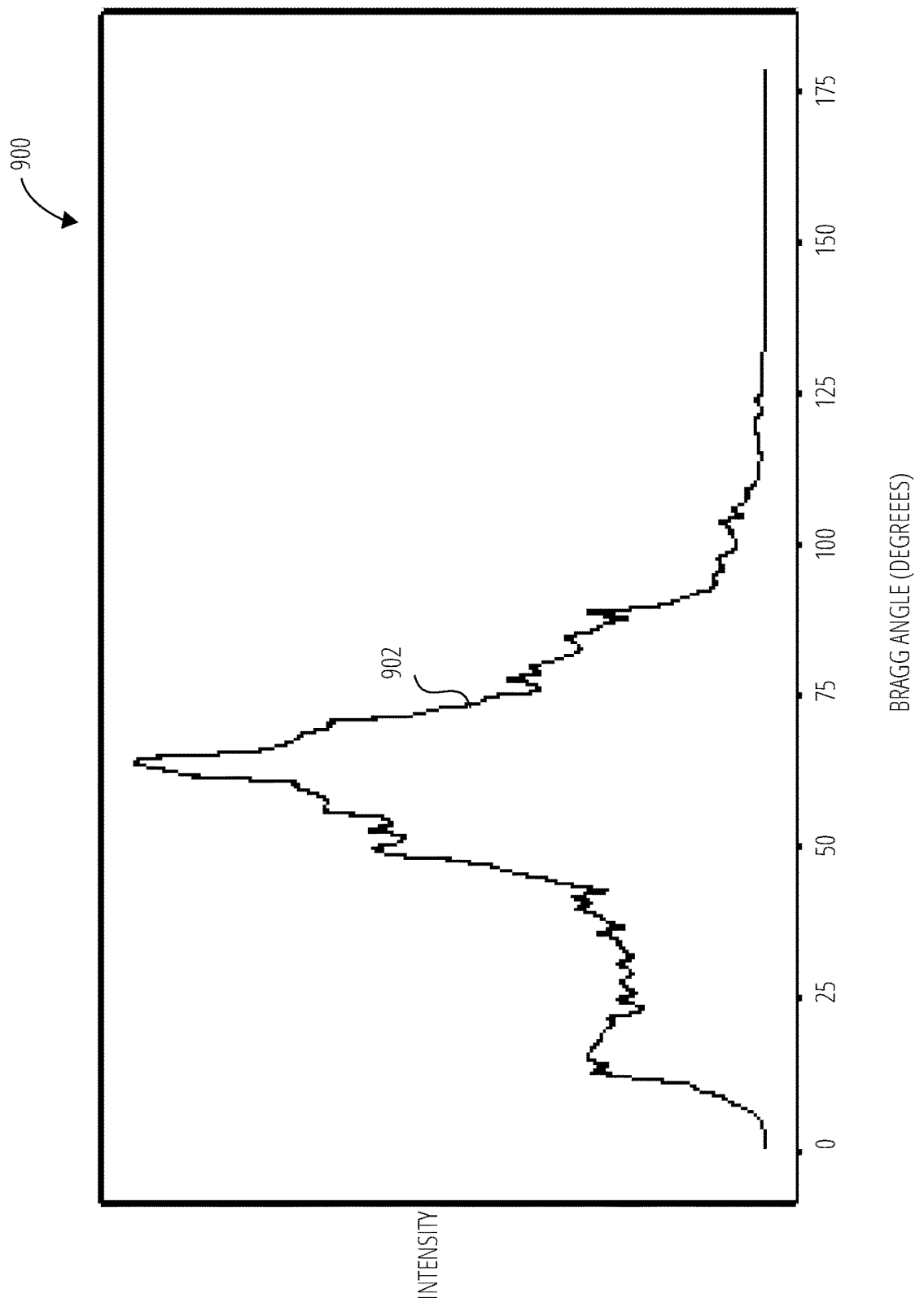
FIG. 9 is a plot of a peak distribution of family 4, according to some embodiments.

FIG. 9 is a plot 900 of a peak distribution 902 of family 4, according to some embodiments. In family 4 membership was 40,770 members. An average number of peaks of the peak distributions of the members of family 4 was about 2.38 peaks.

Figure 10:
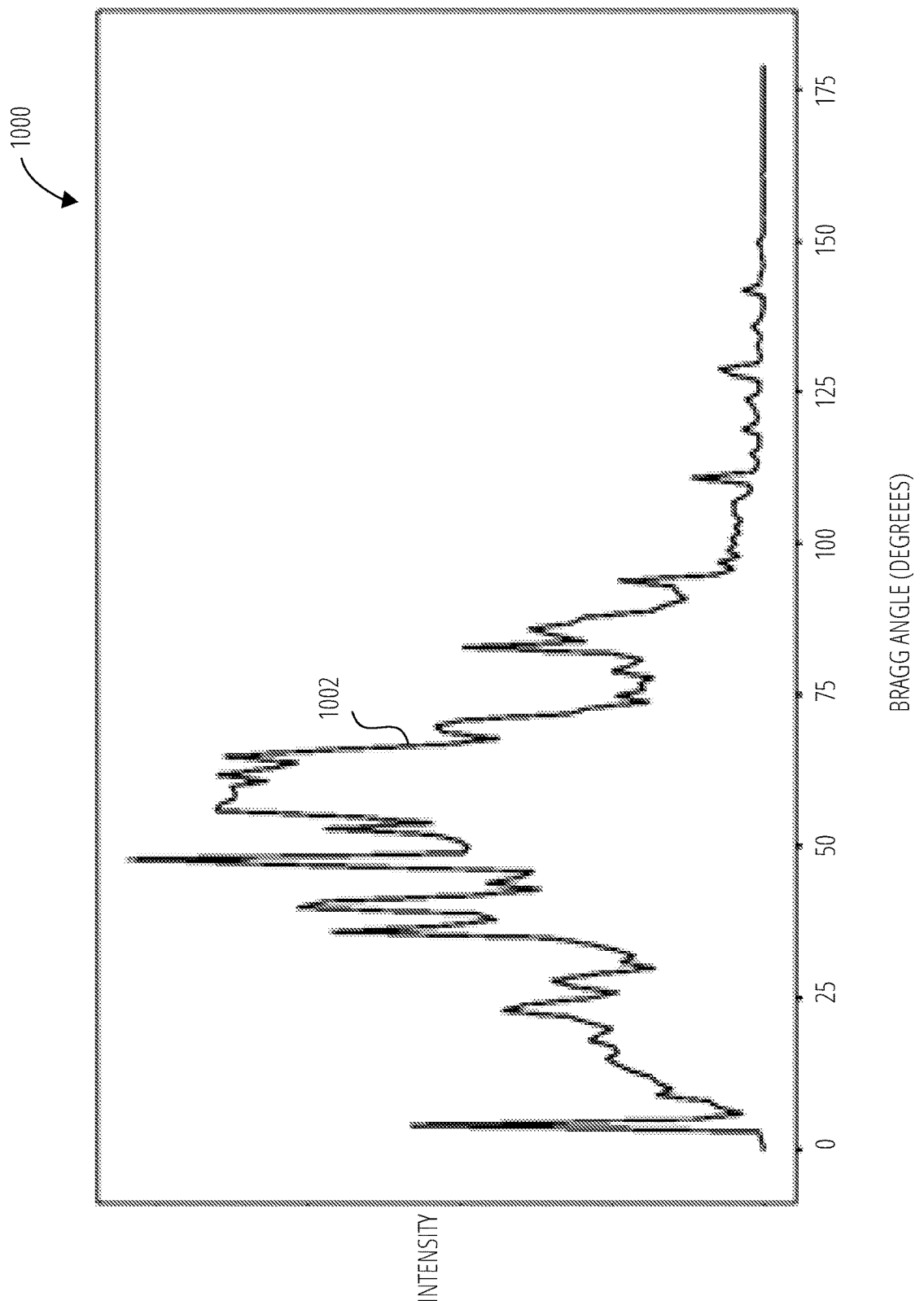
FIG. 10 is a plot of a peak distribution of family 5, according to some embodiments.

FIG. 10 is a plot 1000 of a peak distribution 1002 of family 5, according to some embodiments. In family 5 membership was 31,252 members. An average number of peaks of the peak distributions of the members of family 5 was about 2.45 peaks.

Figure 11:
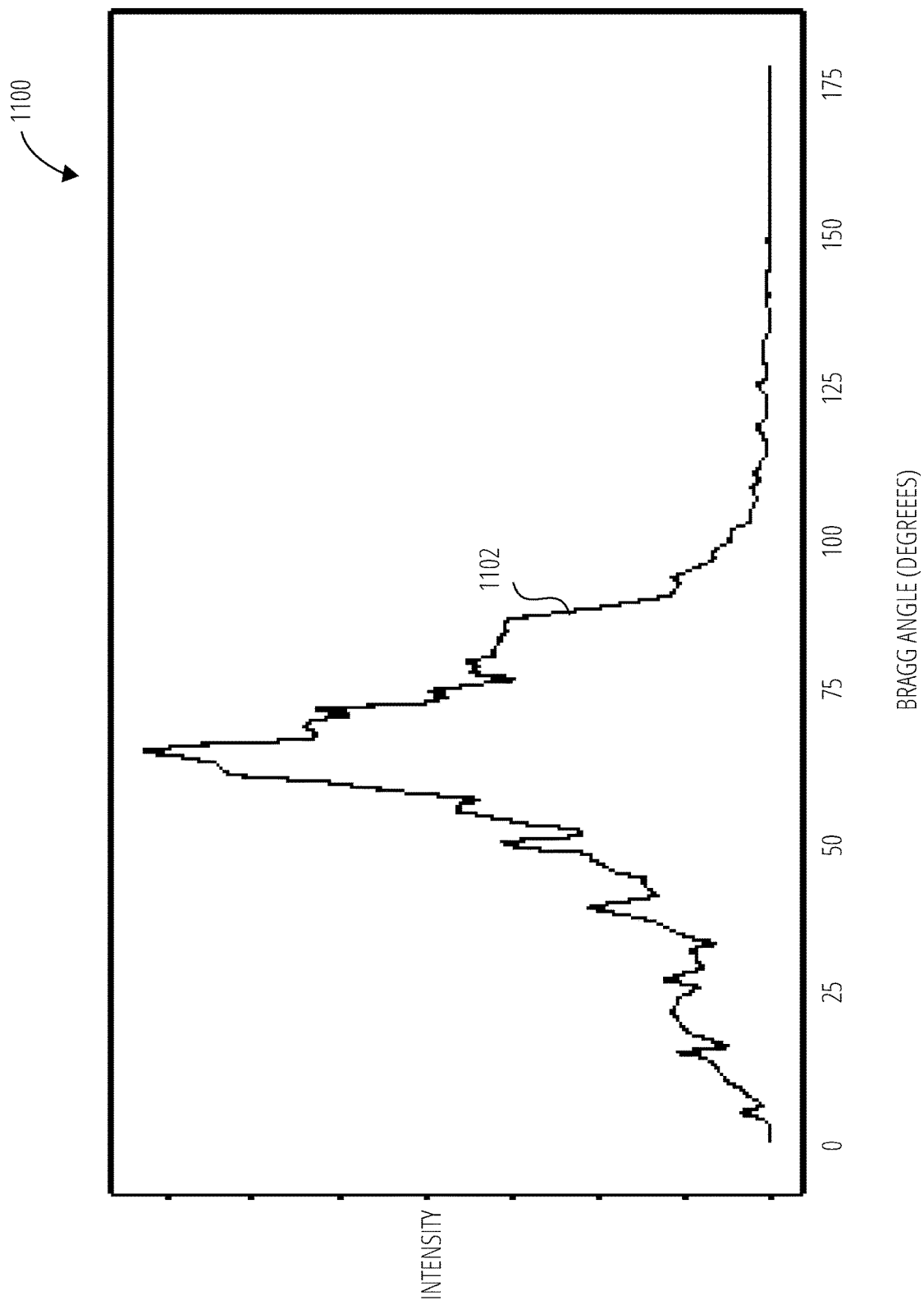
FIG. 11 is a plot of a peak distribution of family 6, according to some embodiments.

FIG. 11 is a plot 1100 of a peak distribution 1102 of family 6, according to some embodiments. In family 6 membership was 24,147 members. An average number of peaks of the peak distributions of the members of family 6 was about 2.36 peaks.

Figure 12:
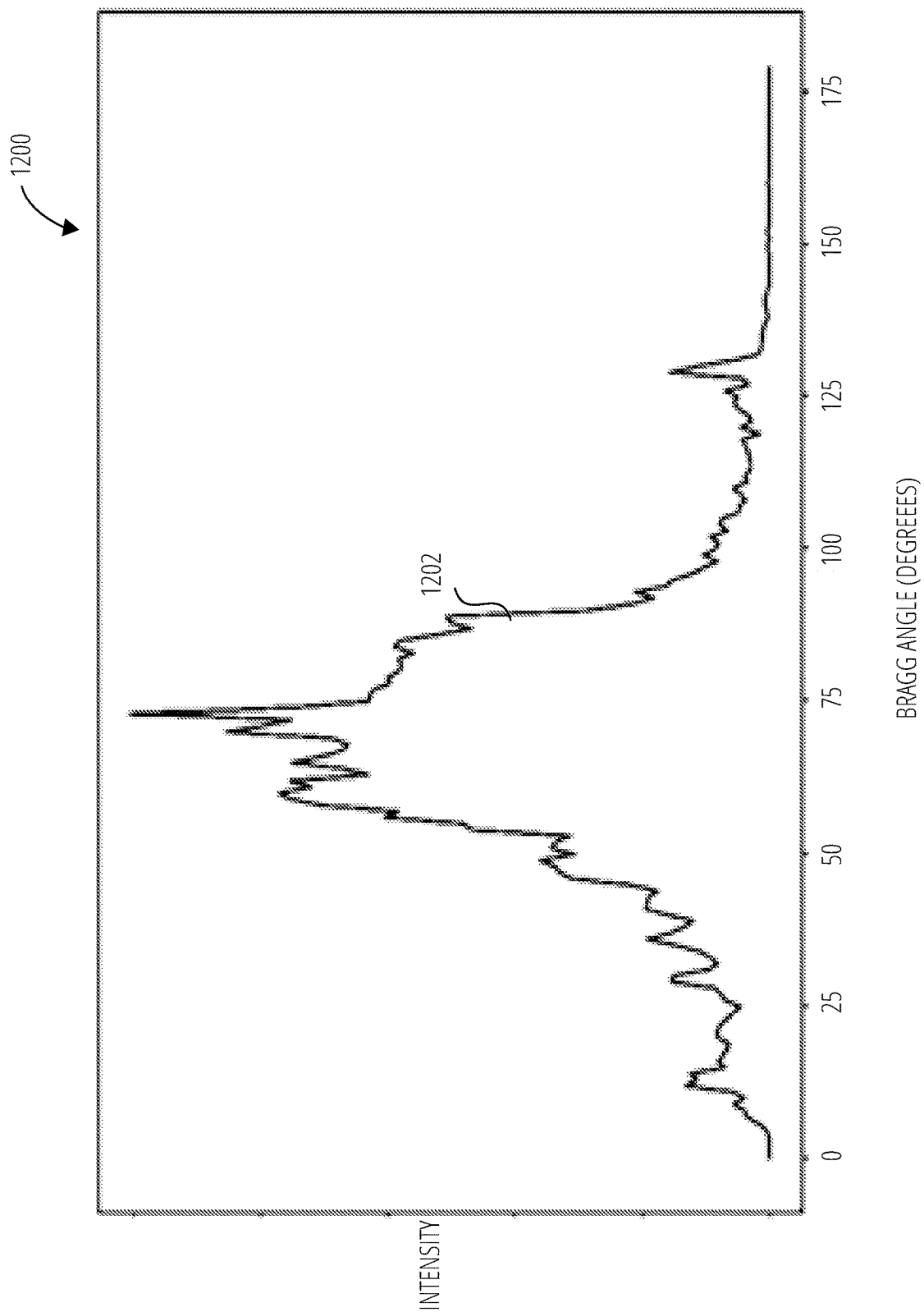
FIG. 12 is a plot of a peak distribution of family 7, according to some embodiments.

FIG. 12 is a plot 1200 of a peak distribution 1202 of family 7, according to some embodiments. In family 7 membership was 48,289 members. An average number of peaks of the peak distributions of the members of family 7 was about 1.74 peaks.

Figure 13:
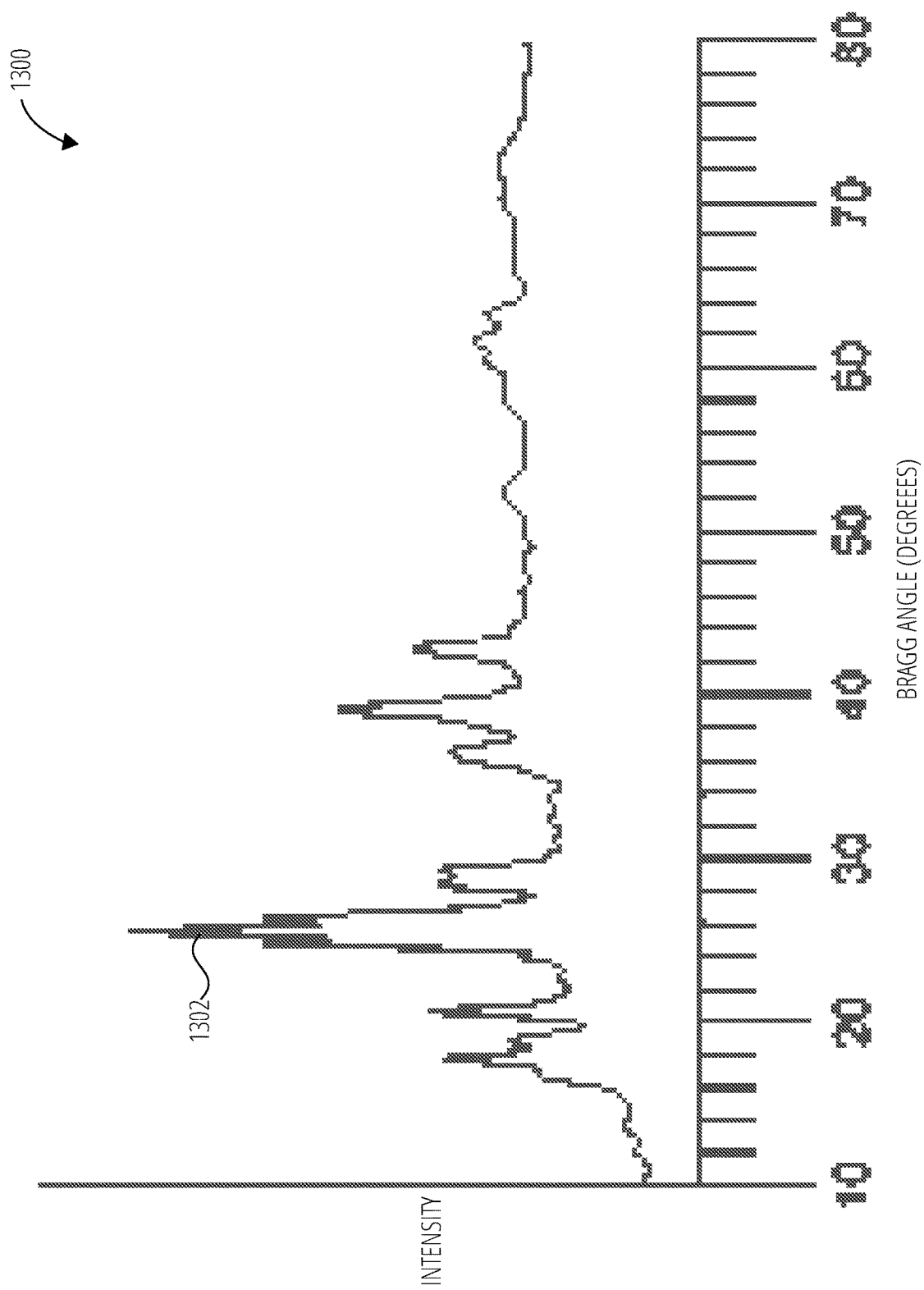
FIG. 13 is a plot illustrating a diffraction profile of an example material sample, according to some embodiments.

FIG. 13 is a plot 1300 illustrating a diffraction profile 1302 of an example material sample, according to some embodiments. The diffraction profile 1302 is an intensity plotted against a Bragg angle. The example material sample included crystalline strontium titanate (SrTiO3) islands on a face-centered cubic structured magnesium oxide (MgO) substrate. A neural network architecture (e.g., the neural networks 216 of FIG. 2) and workflow was validated based on high-resolution STEM imaging and electron diffraction from the example material sample. Utilizing high-resolution capabilities of an aberration-corrected STEM with sub-Angstrom resolution, an atomically resolved high-angle annular dark field image of the individual Sr, Ti, and O atoms was taken oriented along the [100] zone axes by atomic species. A Fast-Fourier transformation (FFT) of the atomically resolved image taken along the same orientation, along with this preferred crystallographic direction, was computed. Based on the FFT, the diffraction profile 1302 is a two-dimensional azimuthal integration of the pattern transformed into a one-dimensional profile. The pattern and diffraction profile 1302 provide the structural classification details for classifying and predicting the structure using a deep-learning model approach.

As previously mentioned, the diffraction profile 1302 was taken based on STEM image data. A similar profile as the diffraction profile 1302 may be obtained simultaneously based on diffraction data. Any material in a scanning transmission electron microscope (STEM), in this case, crystalline SrTiO3 (STO) islands distributed on a rock salt MgO substrate, can be simultaneously imaged with high resolution atomic mass contrast STEM imaging and decoupled with a selective area, Fast-Fourier transform (FFT) to reveal the material's structural details. Based on either electron diffraction or FFT of an atomic image (or both), a two-dimensional azimuthal integration translates this information into a relevant one-dimensional diffraction intensity profile (e.g., the diffraction profile 1302) from which the relative peak positions in reciprocal space can be indexed. Seeding the prediction of crystallography is a hierarchical classification that may utilize a one-dimensional convolution neural network model replicated at each layer from family to space group, forming a nested architecture (see the neural network architecture 1400 of FIG. 14). Based on the derived peak positions in the azimuthal integration profile, the prediction on SrTiO3 is reported in Table 2 below. Table 2 compares from higher to lower symmetry materials, a prediction for various materials.

TABLE 2

| Material | Expectation | $1^{st}$ Prediction | $2^{nd}$ Prediction | $3^{rd}$ Prediction |
|---|---|---|---|---|
| $CeO_2$ | Cubic Fm3m No. 225 | 225 (87.1%) | 219 (5.6%) | 221 (3.6%) |
| C-graphene | Hexagonal $P6_3/mmc$ No. 194 | 194 (90.1%) | 173 (2.5%) | 191 (0.2%) |
| $Bi_{1.15}Sb_{0.71}Te_{0.85}Se_{2.29}$ (BSTS) | Trigonal R3m No. 166 | 166 (26.1%) | 163 (25.7%) | 148 (3.48%) |
| A-phase U | Orthorhombic Cmcm No. 63 | 74 (34.7%) | 19 (33.7%) | 63 (15.9%) |

Figure 14:
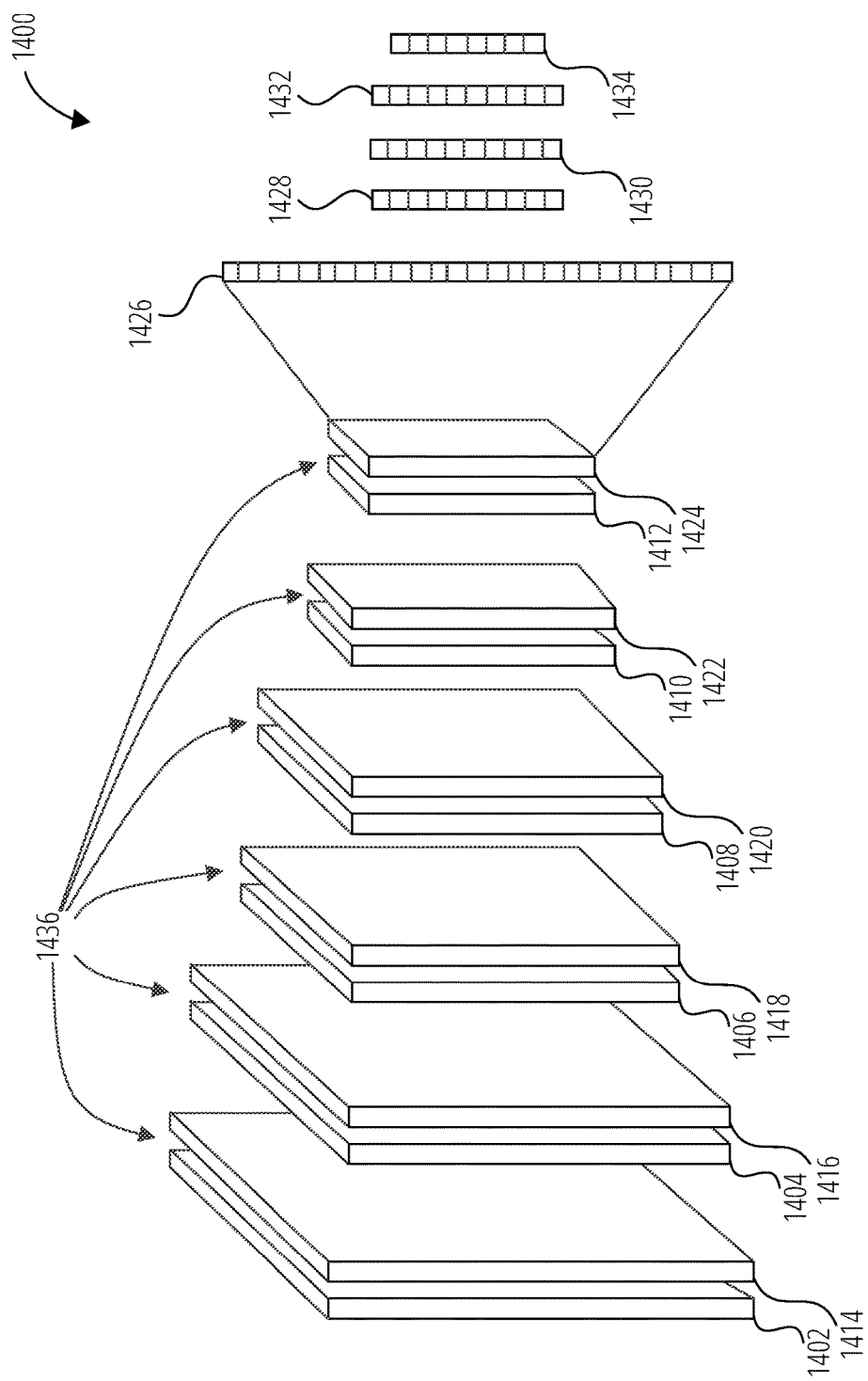
FIG. 14 is a neural network architecture for exploiting deep-learning-based classification for crystallographic information, according to some embodiments.

FIG. 14 is a neural network architecture 1400 for exploiting deep-learning-based classification for crystallographic information, according to some embodiments. The neural network architecture 1400 builds and trains on public and established materials databases, including the Open Crystallography Database (OCD), Materials Project Database (MPD), American Mineralogist Crystallographic Databases (AMCD), and the Inorganic Crystal Structure Database (ICSD). The neural network architecture 1400 is a one-dimensional convolutional neural network (CNN) architecture used to train and evaluate a hierarchical training dataset including 571,340 individual crystals divided amongst seven families, 32 genera, and 230 individual crystallographic space groups. At each level of the hierarchy, a neural network was trained to form a nested hierarchy for classification as shown in FIG. 14. Each CNN includes six convolutional blocks 1436 before three dense layers (e.g., dense layer 1428, dense layer 1430, and dense layer 1432) and a SoftMax 1434 for classification. Convolutional blocks 1436 are formed from a convolutional layer (e.g., convolutional layer 1402, convolutional layer 1404, convolutional layer 1406, convolutional layer 1408, convolutional layer 1410, and convolutional layer 1412), a max pooling layer (e.g., max pooling layer 1414, max pooling layer 1416, max pooling layer 1418, max pooling layer 1420, max pooling layer 1422, max pooling layer 1424), and an activation layer. The convolutional layers have a kernel size of two and start with 180 channels narrowing to 45 channels over the six blocks. Starting in the fourth block (e.g., convolutional layer 1408 and max pooling layer 1422), dropout is applied after the pooling layer. Dropout starts at 0.1 (at max pooling layer 1420) and scales up to 0.2 (at max pooling layer 1422) and 0.3 (at max pooling layer 1424) in the fifth and sixth blocks, respectively.

Due to a lack of grand canonical examples or a human baseline, the neural network architecture 1400 was benchmarked by comparing it to other machine-learning algorithms. Convolutional neural networks outperformed other machine learning methods, including decision forests, support vector machines, and the Naïve Bayes model. In certain situations, random forests appear to outperform convolutional neural networks. Upon delving into the random forest models, it is revealed that random forest models are subject to mode collapse. Despite the models having a high accuracy (of eighty-plus percent), the model hasn't learned to distinguish classes. It predicts the class that comprises 80% of the data every time. Convolutional neural networks are susceptible to mode collapse as well, which occurs most prominently when classifying a crystal into a family.

Optimizing the deep learning model involved tuning varying architectural and training hyperparameters. The model architecture (e.g., the neural networks 216 of FIG. 2) was tested at varying depths, numbers of parameters, layer combinations, and dropout rates. The final model architecture selected includes a flatten layer 1426 and six blocks of convolution (the convolutional blocks 1436). Max pooling (max pooling layer 1414, max pooling layer 1416, max pooling layer 1418, max pooling layer 1420, max pooling layer 1422, and max pooling layer 1424) and dropout were selected based on performance, the number of trainable parameters, and preservation of spatial information. The dense layers (dense layer 1428, dense layer 1430, and dense layer 1432) were tuned. The three dense layers before classification were optimal for producing accuracy.

During hyperparameter optimization, a batch size of 1,000 was chosen in conjunction with weighting by the class occurrence to increase the prevalence of rarer classes in the gradient of each batch. The number of peaks used to classify structure was the hyperparameter had a significant effect on the prediction accuracy. The number of peaks included is determined by a threshold of peak intensity applied to the simulated patterns. Stricter thresholds, 80-90% intensity of the most prominent peak, produced signals with fewer peaks. Relaxed thresholds below 50% produced signals with increasingly many peaks. Using a threshold stricter than 90% of max peak intensity almost universally eliminates all but the maximum peak.

Optimizing structural parameters involved introducing dropout in early layers of the network, which prevented the neural network from learning from sparse signals. Dropout may be implemented to prevent overfitting of data by ignoring portions of noisy signals. A heavily processed binary peak signal that only contains peak locations for three to six peaks may be utilized in training. The binary peak signal may be generated from the azimuthal integration of an FFT or SADP as a rotationally invariant profile where individual peak locations can be identified. A number of peak finding techniques may be used. By way of non-limiting example, a peak finding tool may include a moving window type max voting peak finder that populates a binary signal sampled at less than 0.03 Angstroms in real d-spacing. Such sparse vector representations of the data, including dropout early in the model, may eliminate the signal before propagating to learnable features. This may result in poorly operating models. Instead, dropout may be introduced gradually starting in the third convolution block (e.g., convolutional layer 1406 and max pooling layer 1418), starting at 0.10 and increasing to 0.30, in the last convolutional layers (convolutional layer 1408, convolutional layer 1410, and convolutional layer 1412) to prevent overfitting. The six blocks of convolution (convolutional blocks 1436), max pooling, and dropout condense the signal but maintain the spatial relevance of the original data.

To supplement the data and provide a more robust training regimen for the limited data, cross-validation may be used instead of splitting the data into single training, testing, and validation sets. For cross-validation the data may be split into ten folds. For each fold a model may be trained on the other nine folds. The resulting models may be compared with each other to test for overfitting and generalization. This process may be repeated for each level of the hierarchy. Validation may be performed using experimental data that was not part of the training process for the models.

The number of peaks present were compared with the measured accuracies for each family based on the accompanying confusion matrices. The confusion matrices were organized across seven crystal families (e.g., corresponding to the peak distributions of FIG. 6 through FIG. 12) at the genera level, which constitutes the class hierarchy, followed by the number of peaks used. An identical effect was observed at the space group level as well. Comparisons to other machine-learning methods, including decision forests, support vector machines, and the Naïve Bayes model are reported in Table 3.

TABLE 3

| Model | Family | Class | Space Group |
| --- | --- | --- | --- |
| Random | 14.3% | 10-33% | 4-33% |
| CNN | 80% | 75-95% | 65-99% |
| Random Forest | 51% | 30-60% | 52-84% |
| Naïve Bayes | 16.4% | 5-15% | 2-11% |
| SVM | N/A | 38-47% | 20-57% |

The training and tuning of models may be performed on a high-performance computing system such as an Nvidia DGX-1 system. However, to ensure that the model is usable in a setting where high-performance computing resources are not available, speed benchmarking was done on an entry-level single graphical processing unit (GPU) desktop. In other words, the deep-learning model was evaluated for real-time analysis on a single GPU desktop machine to evaluate the efficiency, sensitivity, and computing necessity for performing augmented crystallographic determination in an accessible manner. The single GPU machine used at runtime had a GTX 1050ti 3 GB graphics card and a 3.2 GHz i7 quad-core processor. Running on this single GPU desktop, the model classified batches of 1,000 profiles loaded in sequence at a rate of 2,600 to 3,500 predictions per second. Conversely, when the same profiles are loaded individually, the model classifies significantly more slowly at a rate of 29 predictions per second. Classification speeds are the same for predictions across families, genera, or space groups. Predicting space groups for 48,289 observations consisting of a single family took 13.2 seconds, which is equivalent to 3,525 predictions per second. Subsequently, the ability to classify structure from diffraction in sub-second times allows for significant acceleration in the acquisition and prediction of at least two orders of magnitude based on the current ability of experts to predict and augment the analysis without previous knowledge.

Based on the input from the atomic resolution SrTiO3 STEM image, the ranked order of predictions made from the FFT-image-based profiles is: 225 (Fm3m), 221 (Pm3m), 205 (Pa3). Upon validation with the known crystal structure, the crystal was determined as structured as space group number 221, Pm3m, subsequently oriented along the [100] zone axes containing the [200] and [110] family of crystallographic reflections. Utilizing the data workflow and pipeline provides the generalized framework for classifying all known materials.

Alongside predictive accuracy, performance on single GPU machines during model tuning and design may also be considered. Though trained on an HPC machine, the model was designed to be deployable on any readily available single GPU machine or an entry-level cloud-based end point. Though the model is capable of classifying at a rate exceeding 3,500 predictions per second for a large batch of preprocessed diffraction signals, this does not consider the time necessary to process diffraction patterns into the appropriate input form. The model is capable of handling large backlogs of data with this predictive speed, but a more realistic workflow for newly generated data would be running small batches or sequentially predicting for each observation. When analyzing each diffraction image through the full pipeline, including the azimuthal integration and peak-finding algorithms, there may be a slowdown in predictive speed. This may be the case in a current workflow from raw to the processed peak position. At 22 predictions per second, real-time analysis of a live camera feed may be achieved.

Figure 15:
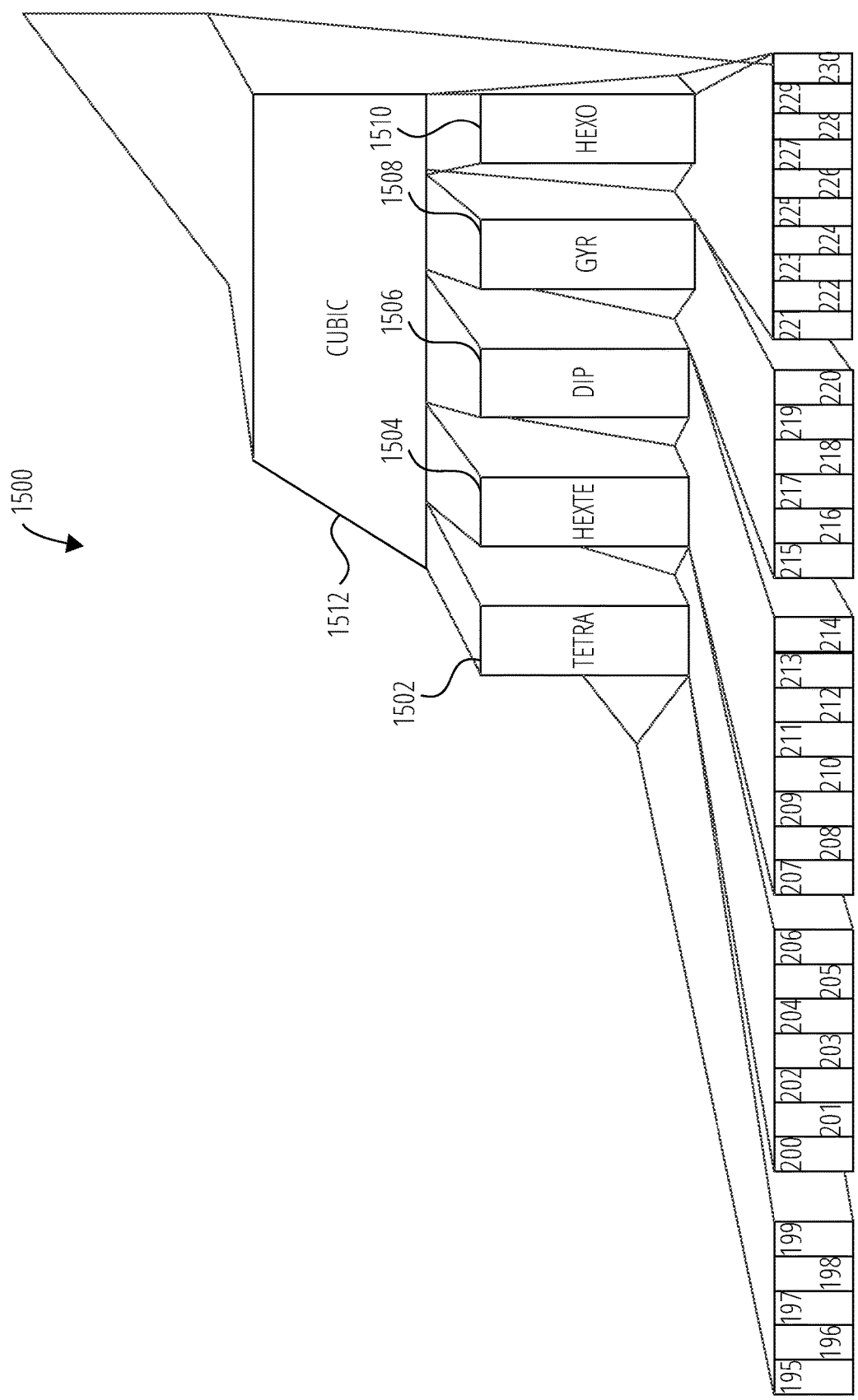
FIG. 15 is a portion of a material classification hierarchy, according to some embodiments.

FIG. 15 is a portion of a material classification hierarchy 1500, according to some embodiments. The material classification hierarchy 1500 includes a genera of cubic 1512, and point groups including tetrahedral 1502, hextetrahedral 1504, diploidal 1506, gyroidal 1508, and hexoctahedral 1510. The tetrahedral 1502 point group includes space group index numbers 195-199. The hextetrahedral 1504 point group includes space group index numbers 200-206. The diploidal 1506 point group includes space group index numbers 207-214. The gyroidal 1508 point group includes space group index numbers 215-220. The hexoctahedral 1510 point group includes space group index numbers 221-230. The neural network architecture 1400 of FIG. 14 is configured to map a diffraction profile (e.g., the diffraction profile 1302 of FIG. 13) to one or more of the space group indexes of the material classification hierarchy 1500.

A generalized workflow and accompanying network for crystallographic materials such as STO at nanometer scale provides the capability to derive crystallographic structure from high-resolution images. Atomic resolution images translate into crystallographic patterns, and an azimuthal integration of the crystallographic pattern resolves the individual interatomic d-spacings and accompanying Bragg angles for subsequent crystal prediction and refinement. The input to the model seeds a deep-learning model for nested prediction, utilizing over 571,340 crystals to provide a capability for deriving crystal structure. Top-two accuracy may be used to discriminate between classes.

After training and tuning the models on a synthetic dataset the models were validated on experimental data. Several well-known materials with known crystallographic structures representative of ongoing materials research programs were selected. The sparse sampling of materials enabled validation of the processing pipeline and hierarchical model. These materials range from cubic to orthorhombic. The materials were each representatives of a crystal family. Higher-symmetry cubic crystals were started with from low to high resolution for nanocrystalline CeO2.

For all of these predictions, the model displays a level of sensitivity to the number of peaks used for classification. In several cases, more than four peaks were detected. Using more than four peaks can present some ambiguity as to which peaks should be used for classification without apriori knowledge. In these cases, simple heuristics may be used to narrow down the selection of peaks. In the case of electron diffraction, peaks below the resolution limit of 0.5 Angstroms and above eight Angstroms (e.g., heavily diffraction limited) may be ignored. Despite this range, this is a robust model to perform generalized crystallographic classification. For example, in the case of BSTS, two different, valid sets of peaks may be fed into the model, generating two different sets of predictions. Future explorations of these different possible detected peak combinations may lead to further improvements on the model and removal of ambiguities in the predictions.

Figure 16:
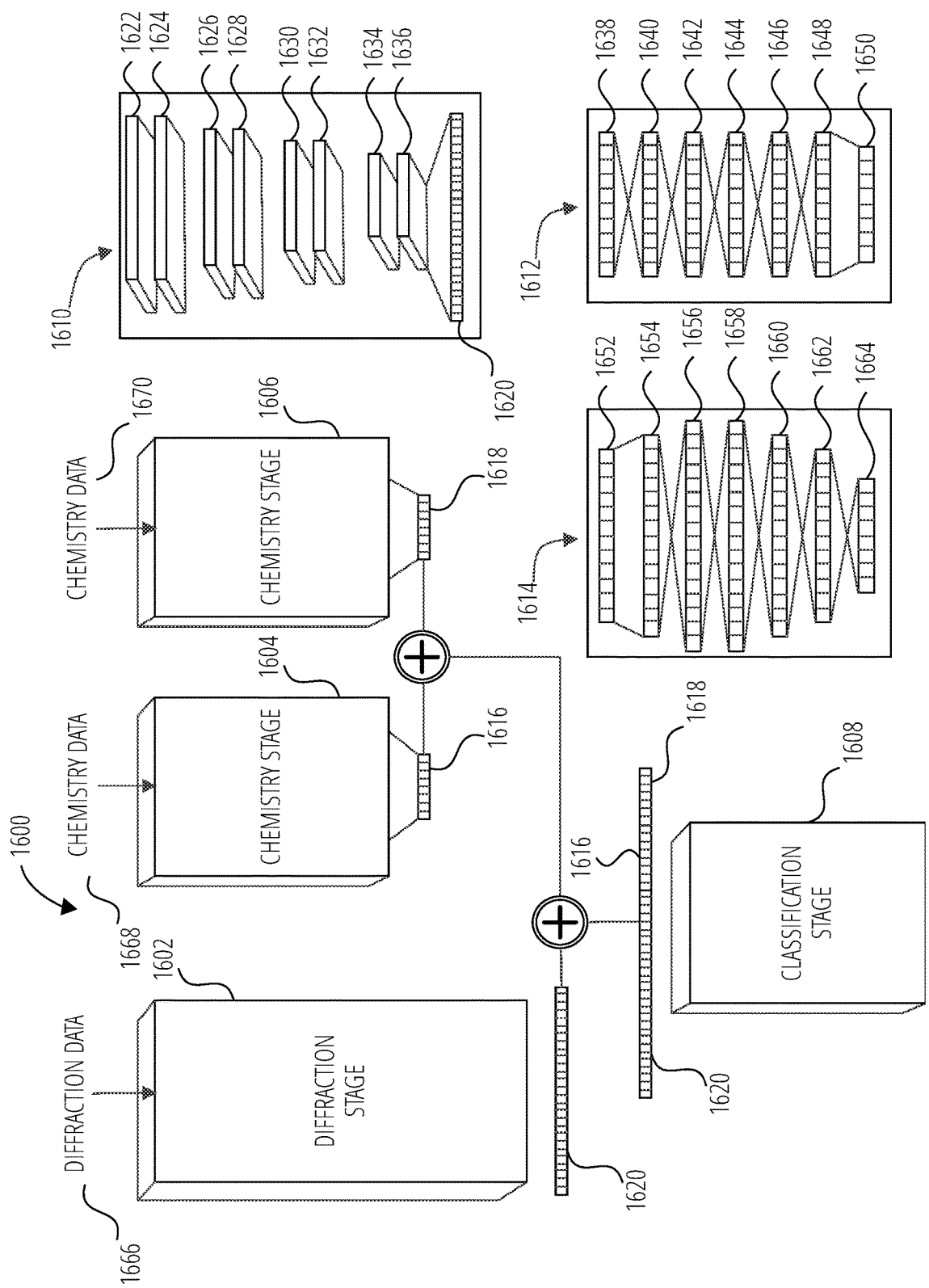
FIG. 16 is a schematic illustration of a neural network, which is an example of the neural networks of the control circuitry of FIG. 1 and FIG. 2.

FIG. 16 is a schematic illustration of a neural network 1600, which is an example of the neural networks 216 of the control circuitry 200 of FIG. 1 and FIG. 2. With respect to FIG. 16 and FIG. 17, development and demonstration of deep learning models for materials classification and discovery from separate or combined prospective of material structure and chemistry will be discussed. Modular neural networks provide a flexible framework to build multimodal models from. With an average accuracy above 85% at each level of the hierarchy a deep learning model may predict a space group of an unknown crystal structure without any a priori information. By providing a ranked list of possible space groups and chemistries, the deep learning-based model and workflow represents a milestone toward fully automated materials applications, where readily identifying materials and their behavior may be provided.

Figure 17:
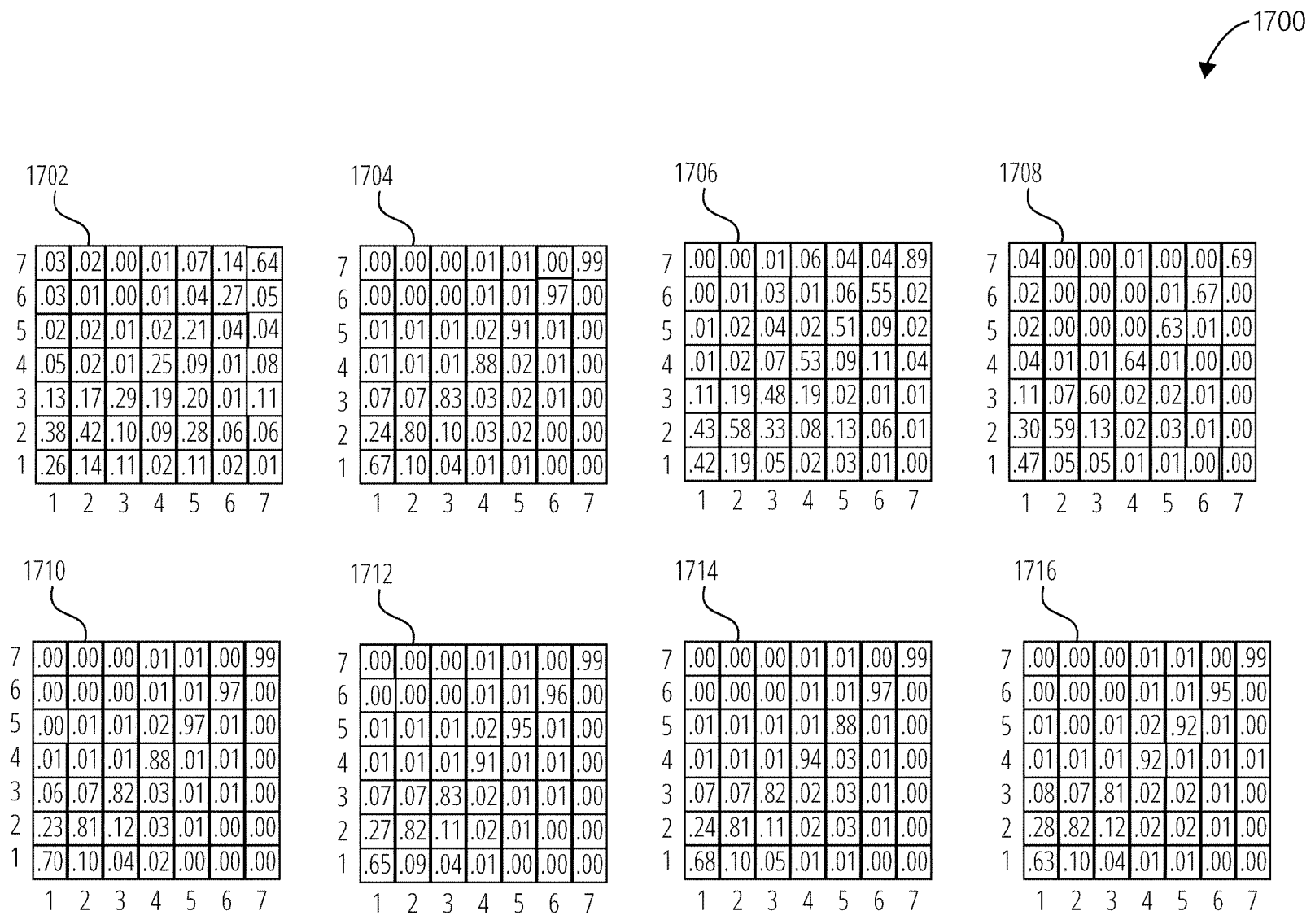

With respect to FIG. 16 and FIG. 17, disclosed is a modular neural network architecture and a simplified and generalizable representation of crystallography and chemistry to classify crystal structure. The generalized representation of diffraction and chemistry data allows for flexibility for users to include in their workflow. The service demonstrates a workflow and analysis tool for high throughput characterization. By reducing complexity and reliance for familiarity, the disclosed embodiments lend themselves to additional discovery opportunities for under-represented and poorly understood materials. Embodiments disclosed herein may also include a method for creating a deep learning service and provide a demonstration of the increased speed of an automated workflow. Embodiments disclosed herein may alleviate repetitive time-consuming tasks and provide a simple workflow to mitigate multidimensional challenges associated with higher throughput methods, which rely on expert knowledge of material structure and chemistry.

Various types of machine learning algorithms are available for use in the neural networks 216. For example, machine learning algorithms including random forests, naïve Bayes, and support vector machines (SVMs) may be compared with artificial neural networks to determine which algorithms would be best suited for the task of structural characterization. Training may be performed using a processor (e.g., the processors 122 of FIG. 1, such as graphical processing units (GPUs)). Neural networks may have many positive properties and higher predictive capabilities for this task than other machine learning algorithms. The availability of large datasets and augmentation methods may make it possible to train neural networks. Neural networks represent a class of learning algorithms. Convolutional neural networks (CNNs) (e.g., multiple pairs of convolution layers and max pooling layers) of a diffraction stage architecture 1610 may be used to capture the diffraction inputs (e.g., diffraction data 1666 of the sensor data 114 of FIG. 1 and FIG. 2) due to their spatial component. For example, the diffraction stage architecture 1610 of FIG. 16 includes four such pairs including convolution layer 1622 and max pooling layer 1624, convolution layer 1626 and max pooling layer 1628, convolution layer 1630 and max pooling layer 1632, and convolution layer 1634 and max pooling layer 1636. Each pair of layers may also include a normalization layer (not shown) and an activation layer (not shown) in addition to the convolution layer and the max pooling layer. Diffraction stages (e.g., diffraction stage 1602) are composed of sequential convolution block pairs ending with a flatten operation (e.g., flatten 1620).

A chemistry stage architecture 1612 may be used to capture chemistry inputs (e.g., chemistry data 1668 and chemistry data 1670 of the sensor data 114 of FIG. 1 and FIG. 2) to produce a chemistry output 1650 (e.g., corresponding to chemistry output 1616 and chemistry output 1618 of chemistry stage 1604 and chemistry stage 1606, respectively). The chemistry stage architecture 1612 may include a series of dense layers (e.g., dense layer 1638, dense layer 1640, dense layer 1642, dense layer 1644, dense layer 1646, and dense layer 1648) of a chemistry stage architecture 1612. Chemistry stages (e.g., chemistry stage 1604) include sequential dense blocks ending with a single dense layer to create a simplified representation of chemistry. Each of the dense layers includes three layers, a dense layer, a normalization layer, and an activation layer, and are designed to find relationships between non-spatially ordered variables.

As previously indicated, the neural network 1600 combines structure (e.g., diffraction) and chemistry. Accordingly, the neural network 1600 includes a diffraction stage 1602 configured to process the diffraction data 1666 and two chemistry stages, chemistry stage 1604 and chemistry stage 1606, configured to process the chemistry data 1668 and chemistry data 1670, respectively. In some embodiments, one or more of the diffraction data 1666, the chemistry data 1668, and the chemistry data 1670 may include diffractograms. The diffraction stage 1602, the chemistry stage 1604, and the chemistry stage 1606 may be examples of the parallel neural network stages 202 of FIG. 2. The neural network 1600 also includes a classification stage 1608 configured to combine flatten 1620 (e.g., an output of the diffraction stage 1602) with a chemistry output 1616 of the chemistry stage 1604 and a chemistry output 1618 of the chemistry stage 1606. The chemistry output 1616 and the chemistry output 1618 may be concatenated, which are in turn concatenated with the flatten 1620, and provided to the classification stage 1608.

The classification stage 1608 has a classification stage architecture 1614 including various dense layers (e.g., dense layer 1652, dense layer 1654, dense layer 1656, dense layer 1658, dense layer 1660, and dense layer 1662) and ending with a SoftMax layer 1664.

Directly classifying space group is complicated by over represented classes. A hierarchical approach, such as that of the neural network 1600, decomposes the difficult classification problem into smaller and manageable tasks. The material classification includes three stages along phylogenic lines: classification of crystal family, symmetry groups, and space groups. In keeping with the phylogenic schema, these hierarchical levels may be referred to as family, genera, and species. At each level of the hierarchy a new model may be trained. An ensemble of models to predict family, and then within each family, models may be trained to predict genera, and lastly for each genera, models may be trained to differentiate species. Due to the large branching nature of the schema, models may not be trained end to end, but instead use previous predictions to determine the proceeding model to use next in the next sequence of processing.

Combining diffraction data 1666 and chemistry data (chemistry data 1668 and chemistry data 1670), the neural network 1600 may learn from distinct inputs. The architecture was created using four stages: three designed to learn from the input data types and one to perform a task, in this case classification. The modular design was created to test various hypothesis and allow for flexibility in training and retraining portions of the network, without challenges to retrain an entire network, but as submodules. The modular architecture may be extended and retrained in parts to incorporate additional datatypes should other data become available.

The diffraction stage 1602, which includes a series of convolutional layers with max pooling (e.g., diffraction stage architecture 1610) may be configured to capture the spatial component of the signal. Lacking a spatial component, chemistry is captured by stacked dense layers (e.g., chemistry stage architecture 1612). During training each layer may be followed by a normalization layer. The outputs of each stage (e.g., diffraction stage 1602, chemistry stage 1604, and chemistry stage 1606) may be concatenated and used as feature vectors for the classification stage 1608, which includes the classification stage architecture 1614 including a series of stacked dense layers ending with a SoftMax layer 1664 for classification.

Stages at different levels of the hierarchy are based on the same architecture. Due to the large number of hyperparameters to test, the optimal parameters, which were found at the family level stage, may be applied to all genera and species level stages. The genera and species level stages may use different final SoftMax layers than the family stage to accommodate for the varying number of classes. Ablation studies may show this optimizing of each stage separately using a recurrent neural network architecture.

As a specific, non-limiting example, a network for classifying family may include a diffraction module, a chemistry module and a classification module. The diffraction module may include four stacked blocks of convolution, pooling, normalization and activation layers. The initial convolutional layer may include a 3×3 kernels with an output tensor of 1×40×900. After pooling the output may be the batch size 1×40×450. Repeating the process of convolution and pooling three times yields a final output shape of 1×40×112, which is then flattened into a 1×4032 tensor to be concatenated with the output of the chemistry module. The chemistry module includes four stacked blocks of dense, normalization, and activation layers. The initial chemistry input is a 1×118 tensor including the atomic composition of the elements present in the material sample (e.g., the material sample 130 of FIG. 1). The dense layer includes 20 nodes and subsequent layers include 15, 11, and 8 nodes, respectively.

The outputs of the two modules may then be concatenated and put into the classification module dense layers. The classification module had four blocks of dense, normalization, and activation layers. Dense layers had 500, 250 and then C nodes, respectively, where C is the number of classes at the stage in the hierarchy. For example, if the classification module was for families, C would be seven. The last layer of the classification module is a SoftMax layer.

Due to the imbalance in membership at all levels of the hierarchy a leave one out cross validation split may be used to generate training and validation data instead of a single training, validation, and testing set. A single balanced testing set would have either been small or used all the examples of the rare classes. Instead, the data may be split into five folds, trained on four, and tested against the remaining portion. Models trained on each fold combination may be aggregated and compared to determine how much the model is overfitting and to see if generalization occurred.

In order to further address the imbalance between classes, a weighting may be applied to the loss function at training to incentivize correctly predicting a rare class. In addition, data augmentation may be used to further bolster rare classes during training to generate more samples.

Starting with a modular architecture presents some challenges when optimizing the complete architecture because it introduces several potential axes for tunable hyperparameters. In some embodiments, an architecture includes three modules that can include a variable number of layers and types of connections. Initial attempts to determine which hyperparameters to hold fixed and which to include in the optimization in one off model comparisons may be used to see if changing a specific parameter (e.g., layer depth, stride, and kernel size) yields noticeable changes to model performance. Due to the size of the search space, initial comparisons may be between partially trained models to increase the cycle time on iterations. Parameters of the augmentation functions may be held constant across all levels within the hierarchy.

To determine which portions of the model contribute most to predictive accuracy, an ablation study may be performed at each level of the hierarchy that compares variations of the model. Augmentations produce different effects at each level of classification. In order to elucidate which portions of the model are most impactful for classification, variations on the model may be trained with the same hyperparameters. At the family level, models that include only the diffraction module, only the chemistry module, permutations on augmentation and without normalization may be tested. Due to the combinatorial nature of possible combinations of attributes for an ablation study, for the genera and species level the ablation studies may start with diffraction only and then added additional features.

To determine what role chemistry and diffraction play on classification, versions of the model that only incorporate one modality may be trained for comparison. A model containing only chemistry may have limited predictive power. Within the cubic class the model may perform at about 98% accuracy and may have a significantly higher chance of accuracy than random selection. A model trained only based on diffraction performs well across all families with an average accuracy of about ~88%, with the largest drop in accuracy between monoclinic and triclinic families. These classes represent those with minimal symmetric operations, resulting in primitive representation on atomic arrangement of materials.

FIG. 17 illustrates confusion matrices 1700 of family level predictions, according to some embodiments. The confusion matrices 1700 include a chemistry only confusion matrix 1702, a diffraction only confusion matrix 1704, a diffraction with wider bins confusion matrix 1706, a diffraction only without normalization during training confusion matrix 1708, a diffraction only with normalization confusion matrix 1710, a diffraction and chemistry confusion matrix 1712, a diffraction and chemistry with diffraction augmentation confusion matrix 1714, and a diffraction and chemistry with combined augmentations confusion matrix 1716. In the confusion matrices 1700, predicted and expected family classification, where predicted is the vertical and expected is the horizontal starting with triclinic (1), monoclinic (2), orthorhombic (3), tetragonal (4), trigonal (5), hexagonal (6), and cubic (7). The chemistry only confusion matrix 1702 is trained on chemistry only, the diffraction only confusion matrix 1704 is trained on diffraction only, the diffraction with wider bins confusion matrix 1706 is trained on diffraction with wider bins, the diffraction only without normalization during training confusion matrix 1708 is trained on diffraction only without normalization during training, the diffraction only with normalization confusion matrix 1710 is trained on diffraction only with normalization, the diffraction and chemistry confusion matrix 1712 is trained on diffraction and chemistry, the diffraction and chemistry with diffraction augmentation confusion matrix 1714 is trained on diffraction and chemistry with diffraction augmentation, and the diffraction and chemistry with combined augmentations confusion matrix 1716 is trained on diffraction and chemistry with combined augmentations. Values in the confusion matrices 1700 are in decimals (0.01 being equal to 1%).

The diffraction with wider bins confusion matrix 1706 shows the effect the number of bins has on the model's ability to predict. The model may be trained using a reduced feature vector with 180 features instead of 900, where parameters including number of layers, stride, kernel size, normalization may remain the same. The model accuracy suffers noticeably, dropping an average of −30% accuracy across all families and mode collapse is observed in the band of misclassifications surrounding orthorhombic (3).

Diffraction only without normalization during training confusion matrix 1708, diffraction only with normalization confusion matrix 1710, diffraction and chemistry confusion matrix 1712, and diffraction and chemistry with diffraction augmentation confusion matrix 1714 are models utilizing both diffraction and chemistry data. These models had key features of chemistry augmentation, diffraction augmentation and normalization removed to evaluate those features' effectiveness. There are marginal improvements from adding in diffraction augmentation, ~1-2% improvement in orthorhombic—cubic, but a decrease in performance of monoclinic of ~5%. Allowing the atomic percentage to vary by a margin of 5 at. % decreases performance at lower symmetry without noticeable increase in accuracy at higher symmetries when predicting family. This behavior suggests materials are not organized over crystal family. Within crystal family, however, considering chemistry improves the classification by as much as 9% as reported below in Table 4.

TABLE 4

|  | Only Diffraction | Diffraction with Chemistry | Diffraction Augmentation | Chemistry Augmentation | Diffraction and Chemistry Augmentation |
|---|---|---|---|---|---|
| Triclinic | 0.975 | +0.001 | −0.005 | −0.002 | −0.006 |
| Monoclinic | 0.849 | +0.007 | −0.052 | −0.009 | −0.075 |
| Orthorhombic | 0.801 | −0.011 | −0.022 | +0.007 | −0.022 |
| Tetrahedral | 0.805 | −0.009 | −0.007 | −0.013 | −0.025 |
| Trigonal | 0.884 | +0.005 | +0.013 | +0.012 | +0.009 |
| Hexagonal | 0.889 | −0.001 | −0.008 | −0.006 | +0.006 |
| Cubic | 0.728 | +0.091 | −0.051 | +0.081 | −0.042 |

Table 4 illustrates results of a family to genera ablation study. Numbers reported in Table 4 are averages across all genera present within the family. Individual genera may perform better than the average for the family. Within each family common genera have higher accuracy than rarer genera. Values in Table 4 are reported in decimals (e.g., 0.01=1%).

With general trends apparent at the family level, a reduced set of model variations were used in the ablation study of the genera level classification. The set of five variations tested were: diffraction, with chemistry and no augmentation, with chemistry and chemistry augmentation, with chemistry and diffraction augmentation, with chemistry and both kinds of augmentation. Table 4 shows the average changes across all genera within each family as different features in the model are included. Adding in chemistry improved the predictive power of models across all crystal families except hexagonal. The largest improvement in accuracy was distinguishing between cubic genera with an average 9% increase in accuracy, but contains significantly higher improvements for less common genera.

Chemistry augmentation had a positive effect on more balanced datasets, with an increase of an average of 2-7% accuracy for most classes. Orthorhombic and Tetragonal crystal families having only chemistry augmentation during training decreased correct classifications of uncommon genera by ~10-15%. Diffraction augmentations had a positive effect for predicting genera within the trigonal and hexagonal families, with an average increase of 2-4%. For the other crystal families chemistry augmentation had a negative effect, lowering accuracies by 8-12%. Within the cubic family distinguishing peaks are tightly clustered distributions with less variance, allowing diffraction peak position to shift by more than 0.02 Angstroms or 3 bins obscures critical information and produce worse models more prone to mode collapse. At lower symmetry there is an imbalance within the data where the peak distributions have higher variance consistent with a reduced number of geometrical operations for these more primitive classes.

Combined augmentations produced more consistent models for predicting genera within Tetragonal, Trigonal, and Hexagonal crystal families with lower variance in performance between the models trained on different folds and better accuracy for rare and uncommon classes, decreases in accuracy for common classes. The tradeoff between higher accuracy for common classes or better predictive power for rare classes represents an interesting choice when considering how the model may be used. The variance in performance from the augmentation functions appears to be a function of data balance and prevalence as well as symmetry within a crystal family.

Table 5 below illustrates a summary of results of a genera to species ablation study. Change in accuracy may be a change in raw accuracy.

within the genera. An occurrence of raw accuracy being higher than scaled accuracy is a symptom of imbalance where the trained model becomes preferential to common species due to prevalence in the training set. Even outside of the extreme cases, imbalance between classes increased when going from the genera level to the species level. Models with just diffraction, combined diffraction and chemistry, and combined data with augmentation were compared for the ablation study and results are captured within Table 5. Chemistry had a more pronounced effect, improving performance predicting species within all genera between 10-35%. Adding in both chemistry and diffraction augmentations led to mode collapse and worse models in a majority of genera.

Despite significant ability to classify materials, it should be noted that information contained in the training data is not uniformly distributed across all space group, crystal families, or material classes. It is unknown if the abundance of crystals in the common classes is representative of the true distribution of materials or sampling bias that is a product of past research efforts being concentrated on specific materials. The imbalance between space groups within the data set may prove to be one of the greatest challenges in producing good models. For the purposes of training and evaluating a deep learning model for material classification, a hierarchical set of models may be trained in light of the imbalances including chemistry, whereas if information becomes available the models can be further improved.

Examples

A non-exhaustive, non-limiting list of example embodiments follows. Not all of the example embodiments listed below are individually indicated as being combinable with all others of the example embodiments listed below and embodiments discussed above. It is intended, however, that these example embodiments are combinable with all other example embodiments and embodiments discussed above unless it would be apparent to one of ordinary skill in the art that the embodiments are not combinable.

Example 1: A system, comprising: a scanning electron transmission microscope (STEM); and an analysis platform integrated with the STEM and configured to combine imaging, spectroscopy, and diffraction into a multi-dimensional dataset by operating simultaneous modes of collection and analysis for the STEM.

Example 2: The system of Example 1, wherein the analysis platform is further configured to resolve two-dimensional (2D) mapping in the STEM for each pixel measured within a predetermined range.

Example 3: The system of Example 2, wherein the predetermined range is less than about 1 nm×1 nm.

TABLE 5

|  | 3 | 4 | 5 | 6 | 7 | 8 | 9 | 10 | 11 | 12 | 13 | 14 | 15 |
|---|---|---|---|---|---|---|---|---|---|---|---|---|---|
| Baseline Raw | 91.2 | 92.8 | 82.4 | 87.4 | 73.7 | 72.6 | 33.2 | 92.7 | 75.5 | 73.6 | 88.8 | 85.2 | 85.5 |
| Baseline Scale | 92.0 | 93.1 | 79.7 | 65.5 | 72.0 | 64.1 | 38.1 | 78.3 | 67.7 | 67.9 | 74.0 | 77.7 | 81.6 |
| With Chemistry | +0.4 | −0.2 | +0.5 | −1.0 | −1.6 | +7.7 | −3.0 | −4.8 | +6.5 | −2.4 | +0.2 | −0.9 | +0.7 |
| Diffraction Aug | −0.6 | +1.3 | −1.6 | −8.0 | +4.0 | +5.5 | +1.7 | −1.2 | +0.7 | +1.1 | +2.2 | +2.8 | +5.1 |
| All Augments | −0.9 | +1.2 | −3.0 | −7.7 | +3.6 | +7.6 | −5.1 | −0.7 | +1.4 | −1.9 | −1.8 | +2.3 | +5.0 |
|  | 16 | 17 | 18 | 20 | 23 | 24 | 25 | 26 | 27 | 28 | 29 | 30 | 31 | 32 |
| Baseline Raw | 92.9 | 95.7 | 83.5 | 94.3 | 98.9 | 63.6 | 98.7 | 96.2 | 98.1 | 86.1 | 17.5 | 62.4 | 95.9 | 83.8 |
| Baseline Scale | 79.4 | 92.2 | 76.1 | 89.6 | 80.8 | 68.1 | 90.9 | 94.8 | 95.8 | 66.5 | 17.5 | 81.3 | 88.3 | 65.2 |
| With Chemistry | −1.1 | −0.2 | −0.4 | −0.6 | −0.1 | +5.4 | −0.4 | +0.9 | −0.3 | −0.7 | −2.9 | +3.3 | +0.2 | +7.3 |
| Diffraction Aug | +0.7 | +0.7 | −3.4 | +1.8 | −0.5 | +11.5 | +0.2 | +1.1 | −0.4 | +0.6 | +3.6 | +3.8 | −2.0 | +1.5 |
| All Augments | −0.1 | +0.7 | −4.2 | +2.0 | −0.6 | +6.5 | +0.2 | +1.4 | +0.0 | +5.4 | −1.3 | −0.7 | −2.1 | +0.9 |

At the species level imbalances between classes creates a much more noticeable effect with mode collapse affecting several genera within the orthorhombic and cubic crystal families, with individual species comprising greater than 90% of the population in their genera. Two different accuracies are reported in Table 5 to highlight the disparity between common and rare species. Raw accuracy is the percentage of correctly classified profiles across all species, and scaled accuracy is the average accuracy of each species Example 4: The system of Example 1, wherein the multi-dimensional dataset includes at least an associated indexable two dimensional diffraction pattern, a quantifiable energy dispersive x-ray or electron energy loss spectrum, and an intensity value associated with atomic contrast high-angular annular dark field STEM imaging.

Example 5: The system of Example 1, wherein the modes include one or more of a materials modeling mode, a diffraction analysis mode, an imaging analysis mode, and a spectroscopy analysis mode.

Example 6: A method for operating a scanning transmission electron microscope (STEM), the method comprising simultaneously acquiring images, spectroscopy, and diffraction information with STEM images and storing the simultaneously acquired data as a multi-dimensional dataset for analysis and display by an interface coupled to the STEM.

Example 7: A system at least substantially as shown in the drawing figures and described in the specification.

Example 8: A device at least substantially as shown in the drawing figures and described in the specification.

Example 9: A method at least substantially as shown in the drawing figures and described in the specification.

While the present disclosure has been described herein with respect to certain illustrated embodiments, those of ordinary skill in the art will recognize and appreciate that it is not so limited. Rather, many additions, deletions, and modifications to the illustrated embodiments may be made without departing from the scope of the present disclosure as hereinafter claimed, including legal equivalents thereof. In addition, features from one embodiment may be combined with features of another embodiment while still being encompassed within the scope of the present disclosure. Further, embodiments of the disclosure have utility with different and various detector types and configurations.

What is claimed is:

1. A material identification system, comprising:
    one or more data interfaces configured to:
        receive first sensor data generated by a first sensor responsive to a material sample; and
        receive second sensor data generated by a second sensor responsive to the material sample; and
    one or more processors operably coupled to the one or more data interfaces, the one or more processors configured to apply the first sensor data and the second sensor data to one or more neural networks to:
        generate a first preliminary set of predictions of an identification of the material sample and a corresponding first preliminary set of certainty information responsive to the first sensor data;
        generate a second preliminary set of predictions of the identification of the material sample and a corresponding second preliminary set of certainty information responsive to the second sensor data; and
        narrow the first preliminary set of predictions based on the second preliminary set of predictions, the first preliminary set of certainty information, and the second preliminary second set of certainty information to generate a set of predictions of the identification of the material sample and a corresponding set of certainty information.

2. The material identification system of claim 1, wherein the first sensor comprises a diffraction sensor including at least one of an x-ray diffraction apparatus, an electron based scattering diffraction apparatus, a selected area electron diffraction apparatus, or a high resolution atomic scale scanning transmission electron microscope.

3. The material identification system of claim 2, wherein the second sensor comprises a chemistry sensor including at least one of an energy dispersive x-ray spectroscopy apparatus, an atom probe tomography apparatus, a mass spectrometer, and an electron energy loss spectroscopy apparatus.

4. The material identification system of claim 2, wherein the second sensor comprises an electron imaging sensor.

5. The material identification system of claim 2, wherein the second sensor comprises a spectroscopy sensor including at least one of an x-ray spectroscopy apparatus and an electron energy loss spectroscopy apparatus.

6. The material identification system of claim 2, wherein the second sensor comprises another diffraction sensor that is different from the diffraction sensor of the first sensor.

7. The material identification system of claim 1, wherein the first sensor data comprises diffraction data.

8. The material identification system of claim 7, wherein the second sensor data comprises at least one of chemistry data, image data, and spectroscopy data.

9. The material identification system of claim 7, wherein the second sensor data comprises diffraction data that is different from the diffraction data of the first sensor data.

10. The material identification system of claim 1, wherein the one or more processors are configured to rank the set of predictions from most certain to least certain based on the corresponding set of certainty information and generate a prediction including a highest ranked prediction of the set of predictions to predict the identification of the material sample.

11. The material identification system of claim 1, wherein the one or more data interfaces is further configured to receive third sensor data generated by a third sensor responsive to the material sample, wherein the one or more processors are further configured to apply the third sensor data to the one or more neural networks to:
    generate a third preliminary set of predictions of the identification of the material sample and a corresponding third preliminary set of certainty information responsive to the third sensor data; and
    narrow the first preliminary set of predictions based on the third preliminary set of predictions and the third preliminary set of certainty information in addition to the second preliminary set of predictions, the first preliminary set of certainty information, and the second preliminary second set of certainty information to generate the set of predictions of the identification of the material sample and the corresponding set of certainty information.

12. The material identification system of claim 1, wherein the one or more processors are configured to generate the set of predictions of the identification of the material sample in real time responsive to receipt of the first sensor data and the second sensor data.

13. The material identification system of claim 1, further comprising one or more data storage devices including one or more databases stored thereon, the one or more databases including material identification information correlating with the first sensor data and the second sensor data, wherein the one or more processors are configured to generate the first preliminary set of predictions and the second preliminary set of predictions based, at least in part, on the material identification information of the one or more databases.

14. The material identification system of claim 13, wherein the material identification information includes at least one of function of scattering angle information, reciprocal lattice spacing information, and chemical composition information.

15. The material identification system of claim 13, wherein the material identification information includes at least one of structure data, chemistry data, morphology data, feature size data, and location data.

16. The material identification system of claim 1, further comprising a scanning transmission electron microscope including the first sensor and the second sensor.

17. A method of identifying a material sample, the method comprising:
generating first sensor data using a first sensor responsive to the material sample;
generating second sensor data using a second sensor responsive to the material sample, the second sensor different from the first sensor; and
applying the first sensor data and the second sensor data to one or more neural networks for:
correlating the first sensor data to material information stored in one or more databases to generate a first preliminary set of predictions of an identity of the material sample;
correlating the second sensor data to material information stored in one or more databases to generate a second preliminary set of predictions of the identity of the material sample; and
narrowing the first preliminary set of predictions responsive to the second preliminary set of predictions to generate a set of predictions of the identity of the material sample.

18. The method of claim 17, further comprising ranking the set of predictions of the identity of the material sample from a least likely prediction to a most likely prediction, and selecting the most likely prediction of the identity of the material sample.

19. The method of claim 17, wherein correlating the first sensor data and the second sensor data to material information stored in one or more databases comprises processing the first sensor data and the second sensor data in parallel neural network stages of the one or more neural networks.

20. The method of claim 19, wherein the one or more neural networks includes two chemistry stages configured to process diffraction data, a diffraction stage configured to process chemistry data, and a classification stage configured to process outputs of the two chemistry stages and the diffraction stage.

* * * * *

UNITED STATES PATENT AND TRADEMARK OFFICE
CERTIFICATE OF CORRECTION

PATENT NO. : 11,852,598 B2  
APPLICATION NO. : 17/309074  
DATED : December 26, 2023  
INVENTOR(S) : Jeffery A. Aguiar Page 1 of 1

It is certified that error appears in the above-identified patent and that said Letters Patent is hereby corrected as shown below:

In the Specification

Column 28, Line 20, change "of -30% accuracy" to --of ~30% accuracy--

Signed and Sealed this
Twenty-fourth Day of December, 2024

Derrick Brent
*Acting Director of the United States Patent and Trademark Office*